United States Patent [19]

Hosotani et al.

[11] Patent Number: 5,315,301

[45] Date of Patent: May 24, 1994

[54] BINARY DATA GENERATING CIRCUIT AND A/D CONVERTER HAVING IMMUNITY TO NOISE

[75] Inventors: Shiro Hosotani; Takahiro Miki; Masao Ito, all of Hyogo, Japan

[73] Assignee: Mitsubishi Denki Kabushiki Kaisha, Tokyo, Japan

[21] Appl. No.: 976,056

[22] Filed: Nov. 13, 1992

[30] Foreign Application Priority Data

Nov. 20, 1991 [JP] Japan .................................. 3-304588

[51] Int. Cl.$^5$ .............................................. H03M 1/06
[52] U.S. Cl. ...................................... 341/94; 341/156; 341/160
[58] Field of Search .................. 341/94, 155, 156, 158, 341/159, 160

[56] References Cited

U.S. PATENT DOCUMENTS

| 4,912,470 | 3/1990 | Hosotani et al. | 341/159 |
| 4,958,157 | 9/1990 | Miki et al. | 341/159 |
| 4,982,193 | 1/1991 | Saul | 341/159 |
| 5,260,706 | 11/1993 | Chung | 341/160 |

OTHER PUBLICATIONS

"Monolithic Expandable 6 Bit 20MHz CMOS/SOS A/D Converter", *IEEE Journal of Solid-State Circuits*, vol. SC-14, No. 6, pp. 926–931, Dec. 1979, by Andrew G. F. Dingwall.

"An 8–MHz CMOS Subranging 8–Bit A/D Converter", *IEEE Journal of Solid–State Circuits*, vol. SC-20, No. 6, pp. 1138–1143, Dec. 1985, by Andrew G. F. Dingwall.

*Primary Examiner*—Howard L. Williams
*Attorney, Agent, or Firm*—Lowe, Price, LeBlanc & Becker

[57] ABSTRACT

An improved parallel-type A/D converter is disclosed, which includes encoder 3 constituted by a pseudo-NMOS type ROM, and encoder 28 constituted by a pseudo-PMOS type ROM. These encoders are connected to the outputs of pre-encoder 2. Averaging circuit 29 receives binary data provided from two encoders to provide average value data of these as converted binary output data. Even in case of multi-addressing, an averaging circuit can provide correct data as converted data. As a result, an A/D converter which is not affected by noise or the like has been obtained.

12 Claims, 27 Drawing Sheets

BINARY DATA GENERATING CIRCUIT AND A/D CONVERTER HAVING IMMUNITY TO NOISE

BACKGROUND OF THE INVENTION

1. Field of the Invention

The present invention relates generally to binary data generating circuits and A/D converters, and more particularly, to a binary data generating circuit and an A/D converter which is less susceptible to noise. The present invention has particular applicability to a parallel-type and a serial-parallel type A/D converters.

2. Description of the Background Art

Conventionally, a converter which converts an analog signal to a digital signal (hereinafter "A/D converter") is widely used for performing digital signal processing with respect to an analog signal. High-speed conversion is also required in A/D converters, since high-speed digital signal processing is required, for example, in the field of video signal processing.

As A/D converters suitable for high-speed conversion, parallel-type and serial-parallel type A/D converters have been known conventionally. These A/D converters employ many comparators and generally, power consumption of A/D converter is approximately determined by the number of the comparators used. In any parallel-type and serial-parallel type A/D converters, the analog input signal is applied to the inputs of a plurality of comparators in parallel. In addition, in serial-parallel type A/D converter, the conversion of an analog signal to a digital signal is performed in series on time axis.

The parallel-type A/D converter is operable at high-speed. However, since it needs many more comparators than those needed by the serial-parallel type A/D converter, power consumption is greater and therefore often used for industrial or electronic machines for service, such as oscilloscope or the like. The serial-parallel type A/D converter is slower than the parallel-type converter. However, since it has small power consumption and can be formed within a small occupied region on a semiconductor substrate, that is to say, suitable for integration, it is often used in consumer products for the private sector. The present invention is applicable to both the parallel-type A/D converter and the serial-parallel type A/D converter.

FIG. 14 is a block diagram showing a general configuration for video signal processing. With reference to FIG. 14, an object not shown is imaged by a video camera 91. Since the video signal provided from video camera 91 is analog, it is converted to the digital video signal by an A/D converter 92. The digital video signal is applied to a digital video signal processing circuit 93, which performs digital signal processing of the video signal. Processed data is applied to a D/A converter 94 and converted to the analog signal therein. The processed analog signal provided from D/A converter 94 is applied to a display unit 95 and a processed image is represented on the screen provided therein (not shown). The foregoing parallel-type or serial-parallel type A/D converter is applicable to A/D converter 92 shown in FIG. 14.

FIG. 15 is a circuit block diagram of a conventional parallel-type A/D converter. The A/D converter shown in FIG. 15 is disclosed in the article entitled "Monolithic Expandable 6 Bit 20 MHz CMOS/SOS A/D Converter", *IEEE Journal of SOLID-STATE CIRCUITS*, VOL. SC-14, NO. 6, pp. 926-931, Dec., 1979, by ANDREW G. F. DINGWALL. For simplicity of description, the A/D converter providing 3-bit digital data is illustrated in FIG. 15.

Referring to FIG. 15, an A/D converter includes a ladder resistance circuit 1 provided with resistors 60 to 70 connected in series between the externally applied reference potentials Vre1 and Vre2, a comparator circuit 4 provided with seven comparators C0 to C6, a pre-encoder 2 provided with 8 AND gates A0 to A7 and an encoder 3 connected to the outputs of pre-encoder 2. Since ladder resistance circuit 1 is provided with resistors 60 to 67 each having the same resistance value, it generates seven reference voltages V0 to V6 determined by the resistance division. Seven reference voltages V0 to V6 are applied to comparators C0 to C6 provided within comparator circuit 4, respectively.

Each of the comparators C0 to C6 provided within comparator circuit 4 compares an analog signal with corresponding one reference voltage to provide 7-bit data (referred to as "thermometer code") which indicates a comparison result. Each bit of thermometer code is applied to respective two adjacent AND gates provided in pre-encoder 2.

Each of AND gates A0 to A7 in pre-encoder 2 has two inputs, one input thereof constituting an inversion input and being connected from an inverter. For example, the j-th AND gate Aj has its inversion input connected to the output of the j-1st comparator Cj-1 and its non-inversion input connected to the output of the j-th comparator Cj. The inversion input of AND gate A0 is grounded and the non-inversion input of AND gate A7 is connected to a power supply potential Vcc. Output signals j0 to j7 provided from AND gates A0 to A7 are applied to encoder 3, where the signals are converted to corresponding binary data B0 to B2.

FIG. 16 is a schematic diagram of a circuit of encoder 3 shown in FIG. 15. As shown in FIG. 16, encoder is implemented by a pseudo NMOS type read-only memory (hereinafter "ROM") to generate a straight binary code. This encoder 3 includes NMOS transistors, selectively turned on responsive to input signals J0 to J6 applied from pre-encoder 2 and PMOS transistors which are turned on by applying a bias voltage $V_{B1}$ thereto. In normal operation, as one of the input signals J0 to J7 is at a high level (data "1"), only NMOS transistor supplied with high level input is turned on. As a result, binary data B0 to B2 corresponding to the input signals J0 to J7 are provided. A relationship between input signals J0 to J7 and binary data B0 to B2 is shown in the following Table 1.

TABLE 1

|  | $B_2 B_1 B_0$ |
|---|---|
| $J_7$ | 111 |
| $J_6$ | 110 |
| $J_5$ | 101 |
| $J_4$ | 100 |
| $J_3$ | 011 |
| $J_2$ | 010 |
| $J_1$ | 001 |
| $J_0$ | 000 |

Since encoder 3 shown in FIG. 16 is of pseudo-NMOS type, current driving ability or load driving ability (corresponding to mutual conductance gm) of PMOS transistors in encoder 3 is indicated to be smaller than that of NMOS transistors. Therefore, only the transistor supplied with high level input is turned on, so that the potentials of bit lines BL0 to BL2 become selectively lowered. As a result, binary output data B0 to B2 are obtained through bit lines BL0 to BL2.

Therefore, in normal operation, when only any one of input signals J0 to J7 is at a high level (i.e., data "1"), binary data B0 to B2 shown in Table 1 are provided from encoder 3. Referring to Table 1, when only the input signal J3 is at a high level, for example, encoder 3 shown in FIG. 16 provides (0, 1, 1) as output data (B2, B1, B0).

Now, the entire operation of A/D converter 5a shown in FIG. 15 will be explained. Predetermined reference voltages Vre1 and Vre2 are applied to a ladder resistance circuit 1. Reference voltages Vre1 and Vre2, in case that this A/D converter 5a is employed as A/D converter 92 shown in FIG. 14, for example, are determined by changeable maximum and minimum potentials of the video signal being input. Ladder resistance circuit 1 divides the voltage difference Vre1-Vre2 by eight resistors 60 to 67 to generate seven reference voltages V0 to V6. Seven reference voltages are applied to comparators C0 to C6 in comparator circuit 4, respectively. Each of the comparators C0 to C6 compares an applied reference voltage with the voltage of an analog input signal to provide data "1" when the analog signal voltage is larger than the reference voltage. On the other hand, when the analog signal voltage is smaller than the reference voltage, data "0" is provided.

FIG. 17 is a signal transition diagram showing the operation of encoder 3 of FIG. 15. With reference to FIG. 17, when potential Vin of analog input signal Si lies between the voltages V3 and V4, comparators C0 to C3 provide data "1". On the other hand, each of comparators C4 to C6 provides data "0", respectively. Therefore, comparator circuit 4 of FIG. 15 provides a thermometer code TC shown in FIG. 17.

Two gates, adjacent to each other, of AND gates A0 to A7 in pre-encoder 2 each receives one corresponding data in thermometer code TC1. Among AND gates A0 to A7, only AND gate A4 that receives data "0" and "1" provides data "1". Other AND gates A0 to A3 and A5 to A7 provide data "0". Therefore, output signals J0 to J7 are provided from pre-encoder 2, in which only signal J4 is "1". Encoder 3, therefore, provides binary output data (B2, B1, B0) = (1, 0, 0) based on Table 1 described above.

The foregoing is a description of the case where A/D converter 5a shown in FIG. 15 operates normally; however, A/D converter 5a is affected by noise or the like, causing frequent malfunction as set forth in the following. First, the factor which causes noise in A/D converter 5a will be described hereinafter.

Referring to FIG. 28, it is assumed that some noise source NS exists in semiconductor substrate 5. In addition, it is also assumed that comparators C0 to C6 are located close to noise source NS on substrate 5 as shown in FIG. 28. Noise overlapped in inner circuits of comparators C0 to C6 becomes larger in the comparator closer to the noise source; however, the comparison result brought to the comparator having smaller difference between analog input signal Si and an applied reference voltage is more susceptible to noise. Accordingly, in the example shown in FIG. 28, comparators C0 and C1 are more susceptible to noise than comparators C3 and C4.

Referring to FIG. 29, it is assumed that signal Si is sampled at a time t2 after the sampling of analog input signal Si at a time t1. Preferably, only the output signal of comparator C0 should be changed from "1" to "0" by the sampling at the time t2; however, such a malfunction as in the following is caused by noise.

As shown in FIG. 30A, it is assumed that waveforms of the output signals of comparators C0 to C6 are changed by noise. At the time t2, in the case where comparators C0 to C6 operate at a time t4 after the sampling of input signal Si at the time t2, comparators C0 to C6 and AND gates A0 to A7 provide output signals as shown in FIG. 30B. That is, since output signals of comparators C0 to C6 are not affected by noise at the time t4, preferable comparison result can be obtained.

Conversely, in the case where comparators C0 to C6 operate at a time t3, comparator C1 erroneously provides "1" as shown in FIG. 30C, causing AND gates A0 and A2 to provide output signals J0 and J2 of "1". That is, pre-encoder 2 provides abnormal output signals J0 to J7, and this abnormal condition is referred to as "multi-addressing".

FIG. 18 is a signal transition diagram for illustrating an abnormal operation of encoder 3 shown in FIG. 15. Comparator 4 shown in FIG. 15 may provide a wrong thermometer code TC2 shown in FIG. 18 by an influence of noise or the like. That is, comparator C3 provides data "0", though it should provide data "1". In addition to this, comparator C4 provides data "1", though it should provide data "0". That is, an abnormal condition referred to as "multi-addressing" is occurring. Since abnormal thermometer code TC2 is applied to pre-encoder 2, as a result, AND gates A3 and A5 in pre-encoder 2 provide data "1". Therefore, as output signals J0 to J7 are provided, in which only signals J3 and J5 are "1", encoder 3 provides binary data, (B2, B1, B0) = (0, 0, 1).

The reason why the binary output data (0, 0, 1) can be obtained will be explained as follows. As shown in FIG. 18, binary output data is (0, 1, 1), when only signal J3 is data "1". On the other hand, binary output data is (1, 0, 1), when only signal J5 is "1". As encoder 3 has such a circuit configuration as shown in FIG. 16, that is, pseudo-NMOS type ROM, a logical product of corresponding bits of two pieces of data (0, 1, 1) and (1, 0, 1), that is "AND" data (0, 0, 1) is provided as binary output data.

In the example described above, binary output data (1, 0, 0) is provided in normal operation as shown in FIG. 17; however, in a wrong operation, binary output data (0, 0, 1) is obtained as shown in FIG. 18. Since a difference between normal data (1, 0, 0) and abnormal data (0, 0, 1) is 4LSB, it can be seen that binary output data having a large abnormal value by the generation of multi-addressing is provided.

Therefore, in a case where A/D converter 5a of FIG. 15 is applied to A/D converter 92 shown in FIG. 14, the binary output data having a large abnormal value is applied to the digital video signal processing circuit 93, and an abnormal image will be represented on the screen of display unit 95.

In the foregoing description, an explanation of a parallel-type A/D converter has been given, and a similar abnormal operation also occurs in a serial-parallel type A/D converter. This will be described hereinafter.

FIG. 19 is a circuit block diagram of a conventional serial-parallel type A/D converter. A/D converter 5b shown in FIG. 19 can be seen in the article entitled "An 8-MHz CMOS Subranging 8-Bit A/D Converter", *IEEE Journal of SOLID-STATE CIRCUITS, VOL.*

SC-20, No. 6, pp. 1138–1143, Dec. 1985, by ANDREW G. F. DINGWALL.

Referring to FIG. 19, serial-parallel type A/D converter 5b includes a reference voltage generating circuit 11 which receives externally applied reference voltages Vre1 and Vre2 to generate the reference voltages of various levels. Reference voltage generating circuit 11 generates reference voltages for more significant bits F0 to F6 and reference voltages for less significant bits H0 to H12 in response to control signals J0 to J7, applying them to a more significant comparator 13 and a less significant comparator 14, respectively. In A/D converter 5b of FIG. 19, as an example, A/D conversion of 6 bits in total including 3 more significant bits and 3 less significant bits is performed. Therefore, more significant comparator 13 receives seven reference voltages for more significant bits F0 to F6 from reference voltage generating circuit 11. On the other hand, less significant comparator 14 receives 13 (=7+6) reference voltages for less significant bits H0 to H12 in order to perform ±3LSB error correction as will be described hereinafter.

More significant comparator circuit 13 has a circuit configuration similar to that of comparator circuit 4 shown in FIG. 15, and thus is provided with seven comparators (not shown) operating similarly. Seven output signals provided from more significant comparator circuit 13 are applied to a more significant pre-encoder 15.

More significant pre-encoder 15 also has a circuit configuration similar to that of pre-encoder 2 shown in FIG. 15, and operates similarly. Eight output signals provided from more significant pre-encoder 15 are applied to a more significant encoder 16. More significant encoder 16 also has a circuit configuration similar to that of encoder 3 shown in FIG. 16, and operates similarly. Therefore, binary output data of more significant bits B3 to B5 are provided from more significant encoder 16 and applied to an error correction circuit 19.

Less significant comparator circuit 14 also has a circuit configuration similar to that of more significant comparator circuit 13. That is, less significant comparator 14 is provided with 13 comparators (not shown) for comparing analog input signal Si with 13 reference voltages H0 to H12 applied from reference voltage generating circuit 11, respectively.

Output signals provided from less significant comparator circuit 14 are applied to a less significant pre-encoder 17. Less significant pre-encoder 17 also has a circuit configuration similar to that of more significant pre-encoder 15, and operates similarly. Output signals provided from less significant pre-encoder 17 are applied to a less significant pre-encoder 18. Less significant pre-encoder 18 also has a circuit configuration similar to that of more significant pre-encoder 16 and operates similarly.

Less significant encoder 18 provides output signals OS, US and B0 to B2 of 5 bits in total. Among these output signals, data indicating the result of the A/D conversion of less significant bits are less significant 3 bits B0 to B2. An overscale signal OS of the most significant bit is applied to error correction circuit 19. An underscale signal US of the second from the most significant bit is applied to error correction circuits 19 and 20. Therefore, error correction circuit 19 receives binary data of more significant bits B3 to B5 and signals OS and US to provide error correction codes E3 to E6. Error correction circuit 20 receives binary data of less significant bits B0 to B2, error correction codes E3 to E6 and signal US to provide binary output data D0 to D5 having the errors corrected.

FIG. 31 is a schematic diagram of less significant comparator 14, less significant pre-encoder 17 and less significant encoder 18 shown in FIG. 19.

FIG. 20 is a schematic diagram of a reference voltage generating circuit 11 shown in FIG. 19. Referring to FIG. 20, this reference voltage generating circuit 11 includes seven ladder resistance circuits 110 to 117 and seven switching circuits 100 to 107 each connected to the outputs of ladder circuits 110 to 117, respectively. Since this reference voltage generating circuit 11 is used for A/D conversion of 6 bits, a total of the 6th power of 2 resistance elements 6 are provided within ladder circuits 110 to 117. Each of ladder resistance circuits 110 to 117 is provided with eight resistance elements 6. For example, the j-th ladder resistance circuit 11j is provided with eight resistance elements 6 connected in series.

Each of switching circuits 100 to 107 connected to the outputs of each of ladder resistance circuits 110 to 117 is provided with thirteen switching elements in total. For example, the j-th switching circuit 10j is provided with thirteen switching elements and these are turned on when the j-th signal Jj of the output signals J0 to J7 provided from more significant pre-encoder 15 shown in FIG. 19 is at a high level.

One terminal of each of switching elements SW0 to SW12 is connected to thirteen comparators (not shown) provided within less significant comparator circuit 14 through the output lines H0 to H12 of reference voltages for less significant bits, respectively. The other terminal of each of switching elements SW3 to SW9 is connected to the connection nodes corresponding to two resistors, adjacent to each other, in ladder resistance circuit 11j. The other terminal of each of switching elements SW0, SW1, SW10 and SW11 is connected to the corresponding connection nodes *1 to *4, respectively as shown in FIG. 20. The output lines F0 to F6 of reference voltages for more significant bits are connected to seven comparators (not shown) provided in more significant comparator 13, respectively.

Generally, the reference voltage generating circuit is designed to generate various difference voltages according to the necessity in the device to which A/D converter is applicable. A/D converters 5a and 5b shown in FIGS. 15 and 19 are often employed in a video signal processing circuit in which high-speed operation is required. In the field of video signal processing, an A/D converter having a conversion rate of approximately 20 MHz, resolution of 8 to 10 bits and full scale voltage of 1.0 or 2.0 V is generally required.

For example, in the A/D converter having resolution of 8 bits and full scale voltage of 1.0 V is split into the reference voltages of 256 levels and the difference of the split voltage between two corresponds to the quantization width. Quantization width is represented by the unit "LSB". In the example described above, 1LSB corresponds to approximately 40 mVn. When A/D conversion of 8 bits is performed by the serial-parallel type A/D converter for more significant 4 bits and less significant 4 bits, the quantization width of less significant A/D conversion is 1LSB (=about 4 mV), and the quantization width of more significant A/D conversion is 16 LSB (=about 64 mV).

FIG. 21 is a circuit block diagram illustrating the error correction circuit 19 shown in FIG. 19. Referring to FIG. 21, error correction circuit 19 includes OR gate 190 having 2 inputs, and full adders 193 to 196 each having 2 inputs. Respective input terminals A of full adders 193 to 195 receive binary data of more significant bits B3 to B5 provided from more significant encoder 16. Input terminal A of full adder 196 is grounded. OR gate 190 receives underscale signal US and overscale signal OS applied from lower encoder 18. The output signal of OR gate 190 is applied to an input terminal B of full adder 193. Respective input terminals B of full adders 194 to 196 receive underscale signal US. Respective carry output terminals and carry input terminals, adjacent to one another, of full adders 193 to 196 are connected in pairs. Error correction codes E3 to E6 are provided, respectively, through sum output terminals SUM of full adders 193 to 196.

FIG. 22 is a block diagram of the error correction circuit 20 shown in FIG. 19. Referring to FIG. 22, error correction circuit 20 includes six switching circuits 210 to 215, inverter 201 and AND gates 202 and 203. Each of the switching circuits 210 to 215 is provided with three switching elements 25 to 27. Inverter 201 receives error correction code E6 to apply inverted signal to each of switching elements 25. AND gate 202 receives error correction code E6 and inverted underscale signal US to apply an output signal to each of switching elements 26. AND gate 203 receives error correction code E6 and underscale signal US to apply an output signal UFW to each of switching elements 27. Switching elements 25 to 27 in switching circuits 210 to 215 turn on or off in response to the output signals provided from inverter 201, AND gates 202 and 203.

One end of each of respective switching elements 25 in switching circuits 210 to 215 receives each of error correction codes E0 to E5. One end of each of respective switching elements 26 is connected to the power supply potential Vcc. One end of each of respective switching elements 27 is connected to a ground potential. The other end of each of three switching elements provided in each of switching circuits 210 to 215 is connected to data output terminals D0 to D5, respectively. Respective switching elements 25 to 27 turn on when applied control signals are high.

Now, the operation of conventional serial-parallel type A/D converter 5b will be explained. Serial-parallel type A/D converter 5b operates in two stages. In the first stage, more significant comparator circuit 13, more significant pre-encoder 15 and more significant encoder 16 operate similarly to comparator circuit 4, pre-encoder 2 and encoder 3 in FIG. 15. That is, the operation similar to that shown in FIG. 17 is performed in circuits 13, 15 and 16. Consequently, more significant encoder 16 provides binary output data of more significant bits B3 to B5 to apply them to error correction circuit 19. Eight output signals J0 to J7 of more significant pre-encoder 15 are also applied to reference voltage generating circuit 11.

In the second stage, reference voltage generating circuit 11 is operated in response to the control signals J0 to J7. Referring to FIG. 20, when the j-th control signal Jj is "1", for example, all switching elements SW0 to SW12 in switching circuit 10j turn on. The fact that the j-th output signal of more significant pre-encoder 15 is "1" means that the potential of analog input signal Si is larger than the reference voltage for more significant bits Fj-1 and smaller than the reference voltage for more significant bits Fj. Therefore, the potential of analog input signal Si is determined in more detail between the reference voltages Fj-1 and Fj by less significant comparator circuit 14 and subsequent circuits.

However, between the A/D conversions of more significant bits and less significant bits, inconsistency in the output data often occurs in the result of A/D conversions of more significant bits and less significant bits by the difference of the characteristics in circuits. To solve these problems, in A/D conversion of less significant bits, conversion within its broader voltage region including applied reference voltages Fj-1 and Fj is performed. That is, in the example shown in FIG. 20, a margin of ±3 LSB including reference voltages Fj-1 and Fj is allowed. One LSB is an input voltage corresponding to 1-bit data "1" provided from A/D converter, and is equal to the difference of the voltages applied to both ends of resistance elements 6 shown in FIG. 20.

Thirteen comparators (not shown) provided in less significant comparator circuit 14 compare analog input signal Si with each of the reference voltages for less significant bits H0 to H12, respectively. Output signals representing a comparison result (thermometer code) are applied to less significant pre-encoder 17. Less significant pre-encoder 17 is responsive to applied thermometer code to provide fourteen output signals J0 to J13 with only one signal showing data "1". Less significant encoder 18 receives output signals J0 to J13, responsive to one signal showing data "1", to provide binary data of less significant bits B0 to B2, overscale signal OS and underscale signal US.

Encoder 18 provides binary data (US, OS, B2, B1, B0) shown in the following Table 2 in normal operation in response to the applied signals J0 to J13.

TABLE 2

|     | US, OS, $B_2$, $B_1$, $B_0$ | US', OS', $B_2'$, $B_1'$, $B_0'$ |
| --- | --- | --- |
| $J_{13}$ | 01010 | 01010 |
| $J_{12}$ | 01001 | 01000 |
| $J_{11}$ | 01000 | 00001 |
| $J_{10}$ | 00111 | 00000 |
| $J_9$ | 00110 | 00101 |
| $J_8$ | 00101 | 00100 |
| $J_7$ | 00100 | 00001 |
| $J_6$ | 00011 | 00000 |
| $J_5$ | 00010 | 00001 |
| $J_4$ | 00001 | 00000 |
| $J_3$ | 00000 | 00001 |
| $J_2$ | 10111 | 00000 |
| $J_1$ | 10110 | 10101 |
| $J_0$ | 10101 | 10101 |

When this A/D converter 5b operates normally, only one of the signals J3 to J10 shows data "1". In comparison between analog input signal Si and the reference voltages for less significant bits H0 to H12, when the potential of analog input signal Si is outside of the region detected in A/D conversion of more significant bits, and is a lower voltage (referred to as "underscale"), one of the signals J0 to J2 shows data "1". On the other hand, when the potential of analog input signal Si is outside of the region detected in A/D conversion of more significant bits, and is a higher voltage (referred to as "overscale"), one of the signals J11 to J13 shows data "1".

When underscale is caused, in addition-subtraction in A/D conversion of more significant bits, the fact is utilized that the most significant bit is "1". When overscale is caused, by utilizing the fact that the second from the most significant bit is data "1", the addition-subtraction is performed in A/D conversion of more significant bits. At this stage, the signal of the most significant bit acts as underscale signal US, while the signal of the second from the most significant bit acts as overscale signal OS.

Error correction circuit 19 operates as an arithmetic unit performing an addition or a subtraction of data "1" to or from the resulting data of A/D conversion of more significant bits on the occurrence of overscale or underscale in A/D conversion of less significant bits. As shown in FIG. 21, error correction circuit 19 applies data (1, 0, 0, 0) to full adders 193 to 196 on the occurrence of overscale, and applies data (1, 1, 1, 1) on the occurrence of underscale. In case where no overscale and underscale happens, data (0, 0, 0, 0) is applied to full adders 193 to 196, and therefore the resulting data of A/D conversion of more significant bits are provided as data E3 to E6 without any change.

Referring to FIG. 22, in error correction circuit 20, an error is corrected on the occurrence of overflow or underflow. When the potential of analog input signal Si is larger than the reference voltage Vre1, overflow occurs. On the other hand, when the potential of analog input signal Si is smaller than the reference voltage Vre2, underflow occurs. The occurrence of overflow is detected when data (1, 1, 1) is provided as a result of A/D conversion of more significant 3 bits and overscale signal OS is "1". The occurrence of underflow is detected when data (0, 0, 0) is provided as a result of A/D conversion of more significant 3 bits and underscale signal US is "1".

In case of overflow, all bits of the output data of A/D converter are preferably "1". When underflow occurs, all bits of the output data of A/D converter are preferably "0". However, on the occurrence of overflow, less significant 3 bits of the output data of error correction circuit 19 is the sum of data (1, 1, 1) and (0, 0, 1), i.e., data (0, 0, 0). In case of underflow, less significant 3 bits of the output data of error correction circuit 19 is the sum of data (0, 0, 0) and (1, 1, 1), i.e., (1, 1, 1). Therefore, error correction circuit 20 is provided so that A/D converter 5b may provide preferable output data on the occurrence of overflow and underflow.

An error correction function in error correction circuit 20 utilizes the fact that signal E6 becomes "1" just in case overflow or underflow occurs in error correction circuit 19. That is, underflow signal UFW is obtained by a logical product (AND gate 203) of signal E6 and underscale signal US. Overflow signal OFW is obtained by a logical product (AND gate 202) of signal E6 and inverted underscale signal US. If neither overflow nor underflow does occur, since respective switching elements 25 in switching circuits 201 to 205 turn on, data E0 to E5 are provided as final output data D0 to D5.

The operation of serial-parallel type A/D converter 5b shown in FIG. 19 has been explained in the foregoing description; however, as the operation for A/D conversion is basically the same as that for parallel-type A/D converter 5a shown in FIG. 15, the foregoing problem of multi-addressing is also occurring in A/D converter 5b. As an example of the occurrence of multi-addressing, wrong output data (US', OS', B2', B1', B0') provided from encoder 18 are shown in the foregoing Table 2. The left side column of Table 2 shows data to be provided in normal operation. By comparing the corresponding data in Table 2, respectively, a big difference caused by the occurrence of multi-addressing can been seen. In addition to this, despite of the occurrence of underscale or overscale, it is pointed out that the case where signal US or OS of "1" can not be obtained may occur.

As described above, multi-addressing has often occurred in conventional parallel-type A/D converter 5a and serial-parallel type A/D converter 5b with data widely different from desired output data has been provided. Any noise or delay in the transmission of the applied clock signal is believed to cause the generation of multi-addressing. In addition to this, malfunction of the comparator in comparator circuit or the output timing gap in an encoder is also taken into account. However, as the occurrence of multi-addressing could not be prevented completely, a big error in the output data caused by multi-addressing has not been prevented.

SUMMARY OF THE INVENTION

One object of the invention is to provide a correct converted data in an A/D converter without being affected by noise.

Another object is to provide a correct converted data in an A/D converter on the occurrence of multi-addressing.

Yet another object is to provide a correct converted data in a serial-parallel type A/D converter without being affected by noise.

Still another object is to provide a correct converted data in a serial-parallel type A/D converter on the occurrence of multi-addressing.

Briefly, a binary data generating circuit according to the present invention, in some aspect, includes the first and second encoders each generating the corresponding binary data having multi-bit in response to a plurality of input signals containing a single activated signal. The first encoder is responsive to two activated signals included in a plurality of input signals to provide a logical product data between the corresponding bits of two binary data corresponding to two activated signals. The second encoder is responsive to two activated signals included in a plurality of input signals to provide a logical sum data between the corresponding bits of two binary data corresponding to two activated signals. This binary data generating circuit also includes an averaging circuit providing average value data of a logical product data provided from the first encoder, and of a logical sum data provided from the second encoder.

In operation, each of first and second encoders provides logical product data and logical sum data between the corresponding bits of two binary data corresponding to two activated signals included in a plurality of input signals, respectively. The averaging circuit provides average value data by performing the average processing of logical product data and logical sum data. Therefore, correct binary data can be obtained without output data being influenced by noise or the like.

According to another aspect of the present invention, A/D converter includes a voltage reference circuit for providing a plurality of voltage reference values; a comparator for comparing the plurality of voltage reference values with an input voltage level and, in response, supplying thermometer code signals on a first plurality of output lines; a pre-encoder receiving the thermometer code signals and, responsive to a signal level change from a first level to a second level on adjacent ones of said output lines, supplying decoded signals on a second plurality of output lines; a first binary encoder receiving the decoded signals for supplying a first binary value representing a logical product of respective bits of binary representations of respective binary data corresponding to the decoded signals; a second binary encoder receiving the decoded signals for supplying a second binary value representing the logical sum of respective bits of the binary representations of the respective binary data corresponding to the decoded signals; and an averaging circuit for adding said first and second binary values to form a sum of the first and second binary values and, in response to said sum, supplying a corrected binary output value.

According to yet another aspect of the invention, an A/D converter includes a reference potential generating circuit generating a plurality of reference potentials each having a different potential level, a thermometer code generating circuit which receives a plurality of reference potentials and is responsive to an analog signal to generate a thermometer code corresponding to the level of the analog input signal, and a pre-encoder which generates a plurality of output signals containing a single activated signal placed at the position corresponding to the peak value indicated by the thermometer code. This A/D converter further includes a first encoder generating corresponding binary data having multi-bit in response to a plurality of output signals provided from the pre-encoder, a second encoder generating the corresponding binary data having multi-bit in response to a plurality of output signals provided from the pre-encoder. The first encoder is responsive to two activated signals included in a plurality of output signals provided from the pre-encoder to provide a logical product data between the corresponding bits of two binary data corresponding to two activated signals. The second encoder is responsive to two activated signals included in a plurality of output signals provided from the pre-encoder to provide a logical sum data between the corresponding bits of two binary data corresponding to two activated signals. This A/D converter further includes an averaging circuit providing average value data of logical product data and logical sum data provided from the first and second encoders, respectively.

According to still another aspect of the present invention, a serial-parallel type A/D converter includes a decision circuit for more significant bits determining more significant bits of converted digital output data in response to an analog input signal; a reference potential generating circuit generating a plurality of reference potentials each having a different level within the range determined by more significant bits in response to more significant bits of digital output data; a comparator for comparing said plurality of reference potentials with an input voltage level and, in response, supplying thermometer code signals on a first plurality of output lines; a pre-encoder receiving the thermometer code signals and, responsive to a signal level change from a first level to a second level on adjacent ones of the output lines, supplying decoded signals on a second plurality of output lines; a first binary encoder receiving the decoded signals for supplying a first binary value representing a logical product of respective bits of binary representations of respective binary data corresponding to the decoded signals; a second binary encoder receiving said decoded signals for supplying a second binary value representing the logical sum of respective bits of the binary representations of the respective binary data corresponding to the decoded signals; and an averaging circuit for adding the first and second binary values to form a sum of the first and second binary values and, in response to the sum, supplying a corrected binary output value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
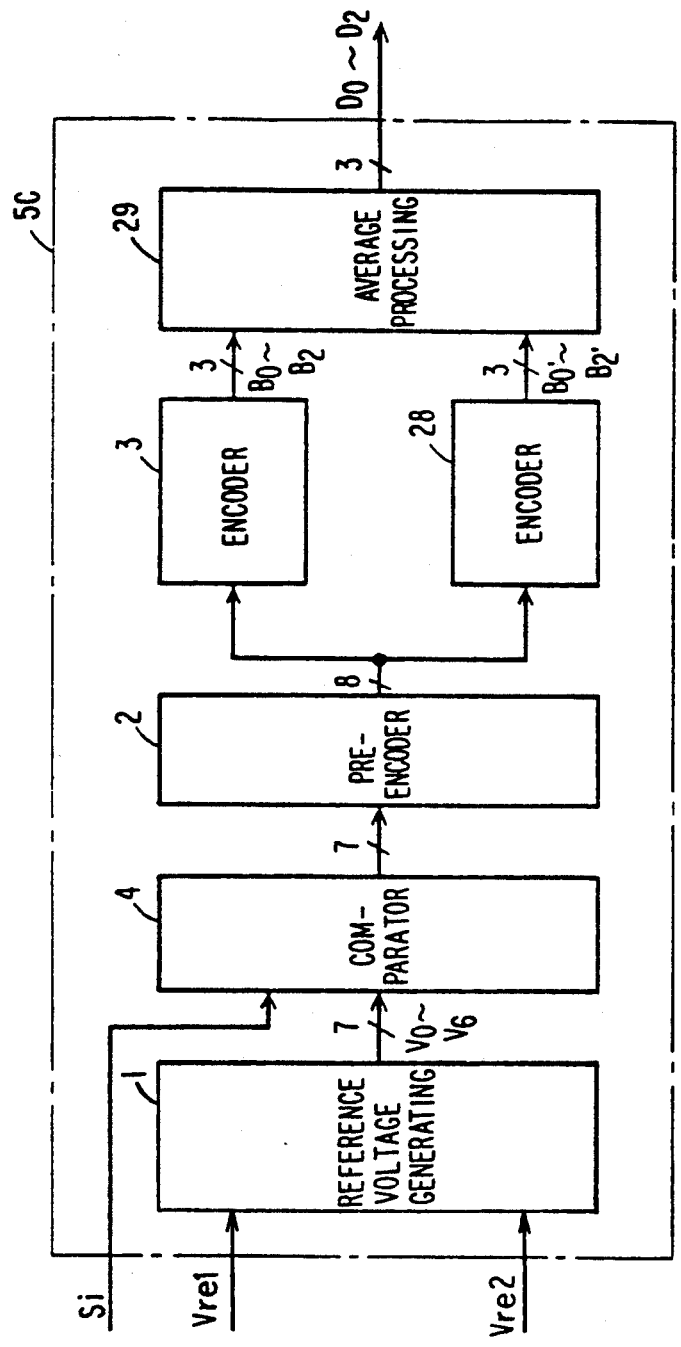
FIG. 1 is a block diagram of a circuit of a parallel-type A/D converter showing one embodiment of the present invention.

FIG. 1 is a block diagram of a circuit of a parallel-type A/D converter showing one embodiment of the present invention. In FIG. 1, for facilitating the description, a 3-bit A/D converter 5c is shown. Referring to FIG. 1, this A/D converter 5c includes a reference voltage generating circuit 1 which receives externally applied reference voltages Vre1 and Vre2 to generate seven reference voltages V0 to V6, a comparator circuit 4 provided with seven comparators (not shown) and a pre-encoder 2 connected to the outputs of comparator circuit 4. Since reference voltage generating circuit 1, comparator circuit 4 and pre-encoder 2 are the same as the conventional ones shown in FIG. 15 in circuit configuration and operation, the explanation is not repeated.

Figure 15:
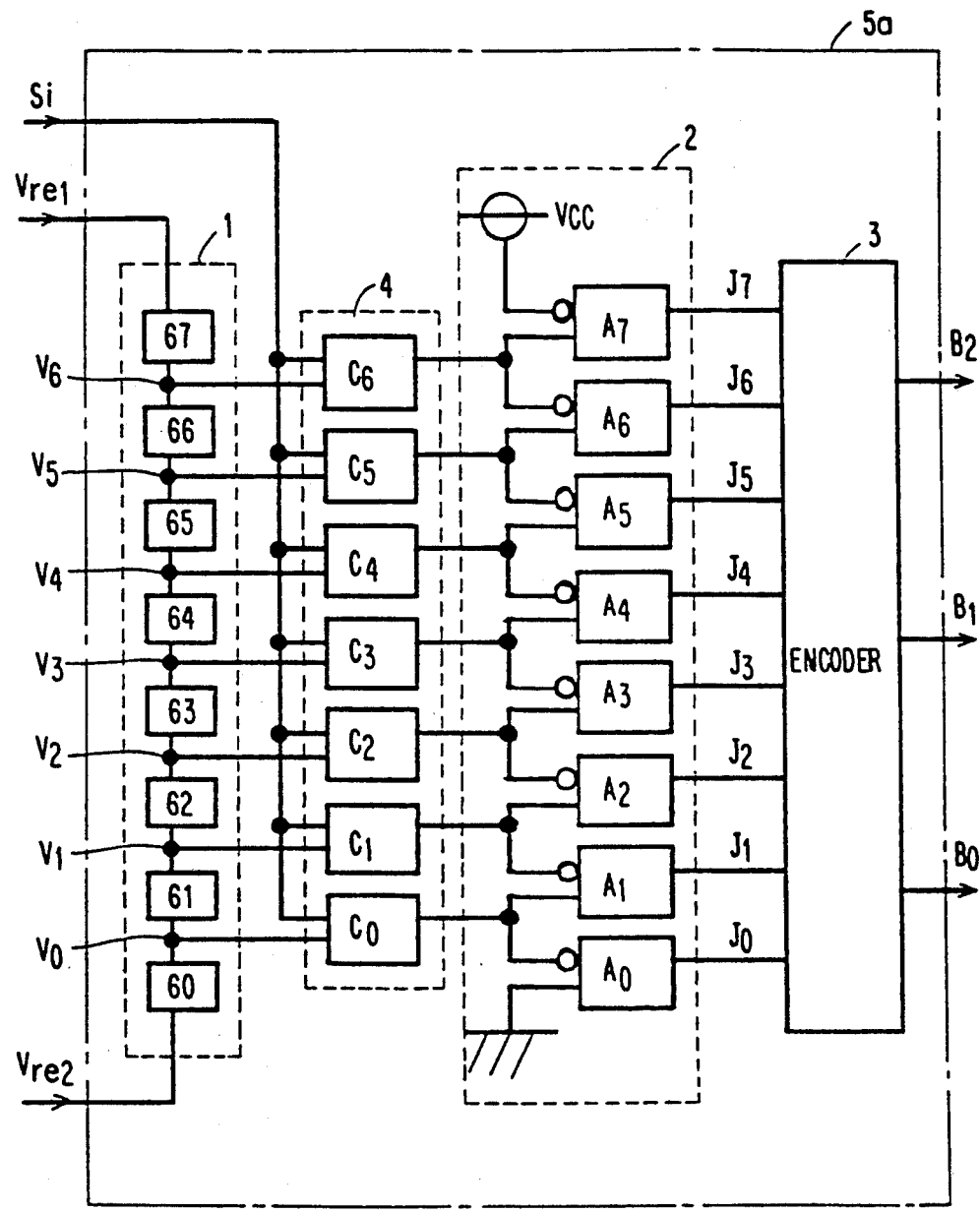
FIG. 15 is a block diagram of a circuit of a conventional parallel-type A/D converter.

Compared with A/D converter 5a shown in FIG. 15, A/D converter 5c shown in FIG. 1 further, includes an encoder 28 and an averaging circuit 29. Encoder 3 shown in FIG. 1 is also the same as encoder 3 shown in FIG. 5 in circuit configuration and operation. Encoder 3 is implemented by a pseudo-NMOS type ROM as shown in FIG. 16, while encoder 28 is implemented by a pseudo-PMOS type ROM as shown in FIG. 2.

Figure 2:
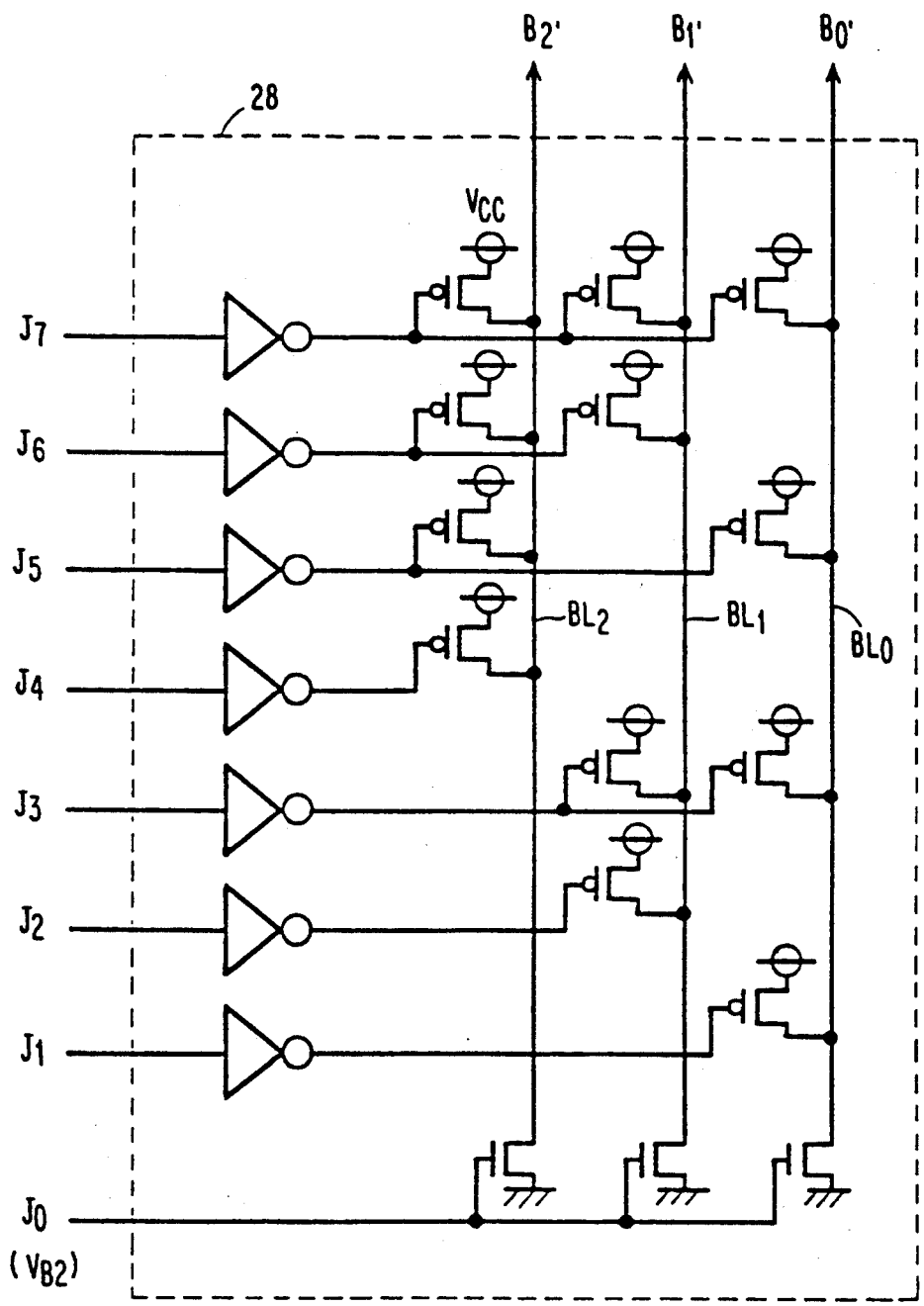
FIG. 2 is a schematic diagram of a circuit of an encoder 28 shown in FIG. 1.

Referring to FIG. 2, encoder 28 comprises inverters receiving signals J1 to J7 applied from pre-encoder 2, respectively, PMOS transistors selectively connected between a power supply potential Vcc and bit lines BL0 to BL2, and three NMOS transistors connected between a ground potential and bit lines BL0 to BL2. The gates of three NMOS transistors are connected to receive signal J0.

Figure 16:
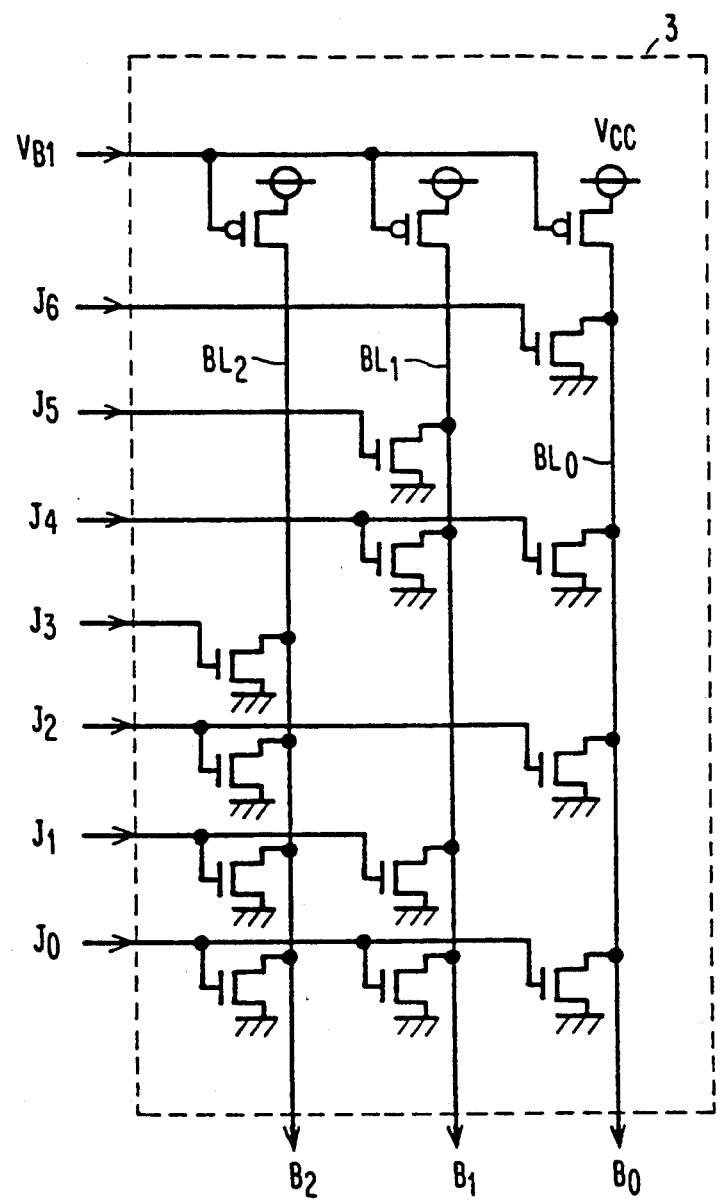
FIG. 16 is a schematic diagram of a circuit of the encoder 3 shown in FIG. 15.
Figure 17:
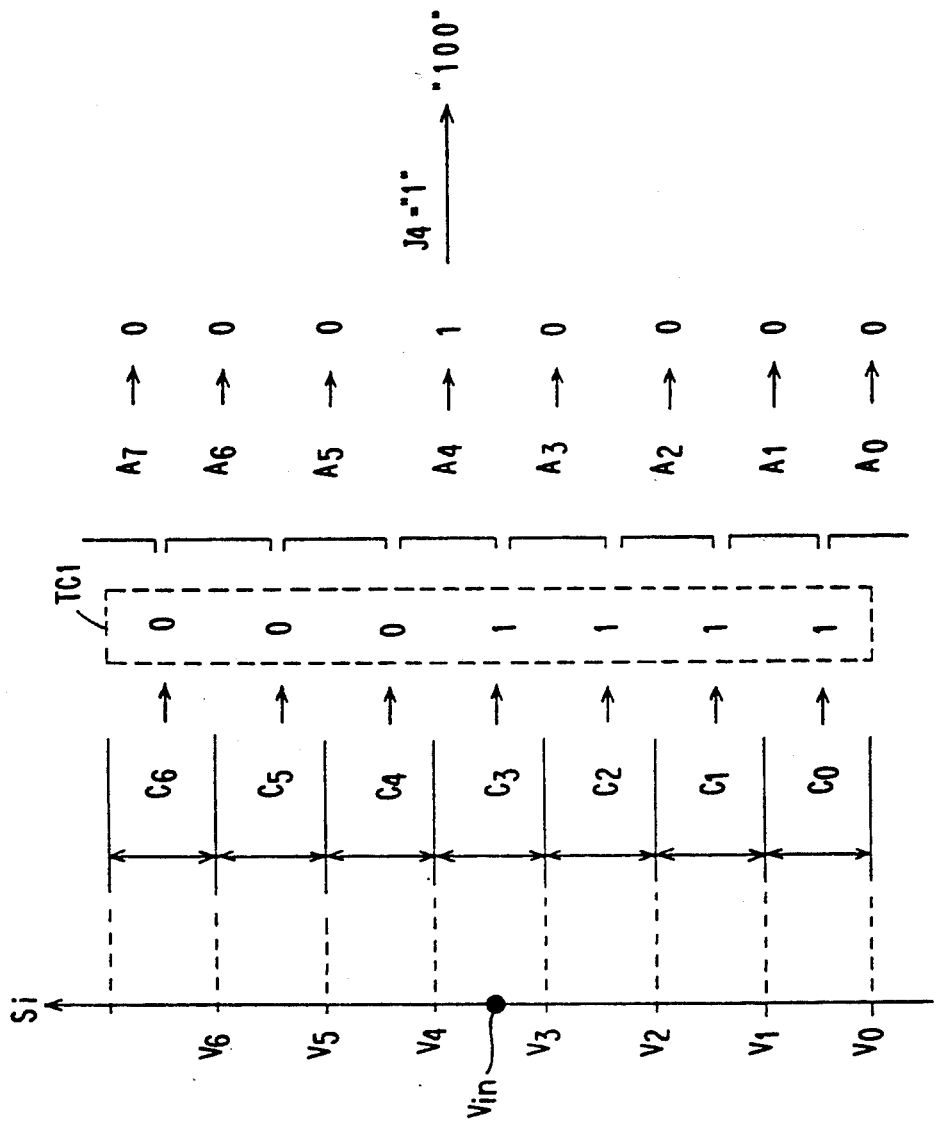
FIG. 17 is a signal transition diagram illustrating a normal operation of the encoder 3 shown in FIG. 15.

Encoder 28 shown in FIG. 2 performs an operation similar to that of encoder 3 shown in FIG. 16 to provide a straight binary code. In other words, encoder 28 is responsive to input signals J0 to J7, only any one of which is "1", to provide data B0 to B2 shown in the foregoing Table 1. Current driving ability or load driving ability (mutual conductance gm) of NMOS transistor provided in encoder 28 is pointed out to be smaller than that of PMOS transistors.

Figure 3:
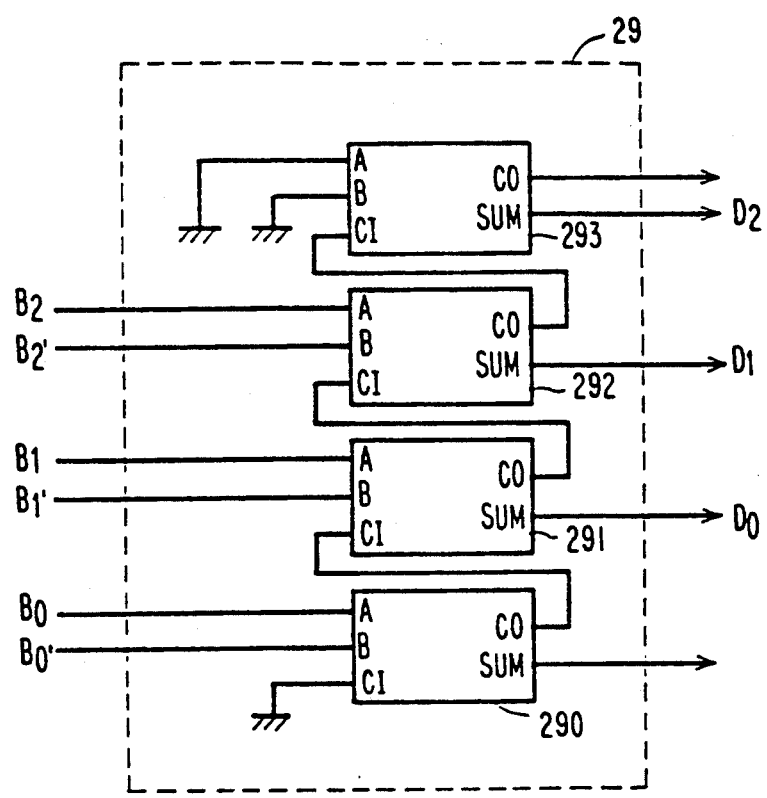
FIG. 3 is a schematic diagram of an averaging circuit 29 shown in FIG. 1.

FIG. 3 is a schematic diagram of averaging circuit 29 shown in FIG. 1. Referring to FIG. 3, averaging circuit 29 includes four full adders 290 to 293. Each of input terminals A of full adders 290 to 292 receives binary data signals B0 to B2 applied from encoder 3, respectively. Each of input terminals B of full adders 290 to 292 receives binary data signals B0' to B2' applied from encoder 28, respectively. Each of carry output terminals CO and each of carry input terminals CI are connected together between every adjacent two of full adders 290 to 293. Two input terminals A and B of full adder 293 are grounded. Carry input terminal CI of full adder 290 is also grounded. Final converted binary output data D0 to D2 are provided through sum output terminals SUM of full adders 291 to 293. The data provided from terminal SUM of full adder 290 is deleted. Thus, average value data D0 to D2 of two applied binary data B0 to B2 and B0' and B2' are obtained.

Figure 23:
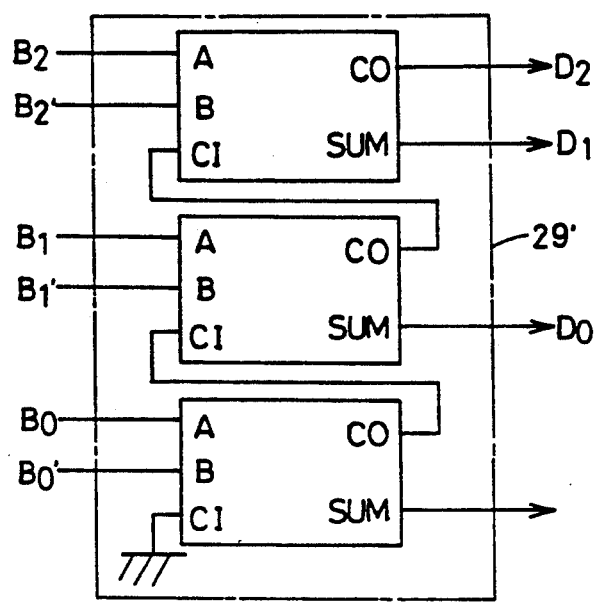
FIG. 23 is a schematic diagram of a circuit showing another example of the averaging circuit 29 of FIG. 3.

An averaging circuit 29' more simplified than averaging circuit 29 of FIG. 3 is shown in FIG. 23. Averaging circuit 29' shown in FIG. 23 operates similarly to circuit 29 shown in FIG. 3.

Now, the operation of A/D converter 5c shown in FIG. 1 will be explained. Since the operation in the first half of A/D conversion is similar to that of A/D converter 5a shown in FIG. 15, the explanation is not repeated.

Firstly, when A/D converter 5c is not affected by noise or the like, two encoders 3 and 28 provide binary data B0 to B2 and B0' to B2' each of which has the same value, respectively. Averaging circuit 29 shown in FIG. 3 adding two binary data B0 to B2 and B0, to B2, In this case, since two binary data have the same value, the same value as two data is obtained as output data D0 to D2. For example, when (B0, B1, B2)=(B0', B1', B2')=(1, 0, 1), add data in averaging circuit 29 shown in FIG. 3 is (1, 0, 1, 0). Since LSB of the output data of averaging circuit 29 is deleted, data (1, 0, 1) is obtained as binary output data (D0, D1, D2).

Figure 4:
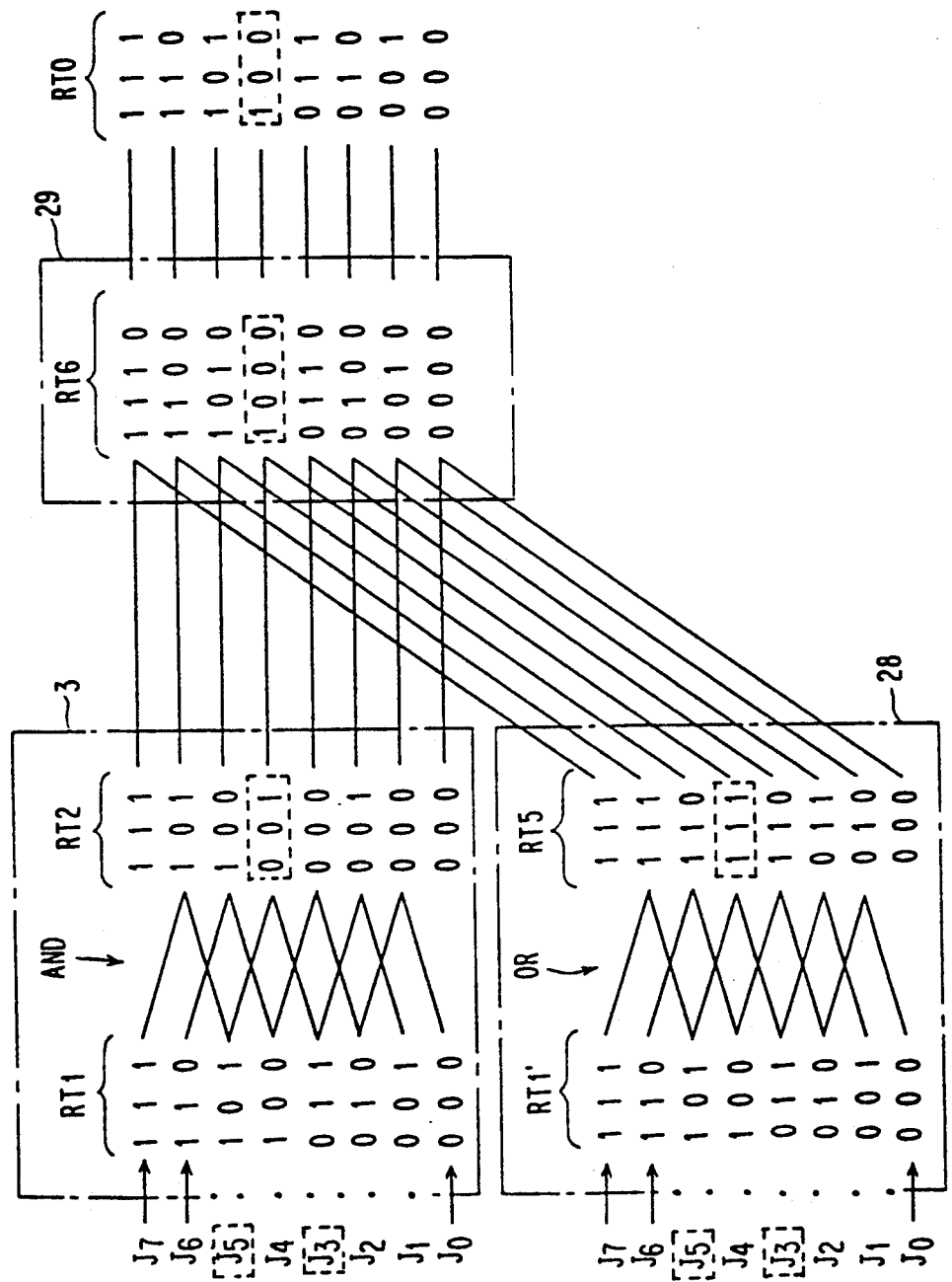
FIG. 4 is a signal transition diagram on the occurrence of multi-addressing in the A/D converter shown in FIG. 1.

Now, the operation of A/D converter 5c on the occurrence of multi-addressing will be described. FIG. 4 is a signal transition diagram on the occurrence of multi-addressing in A/D converter 5c shown in FIG. 1. Referring to FIG. 4, each of data groups RT1 and RT1' shows binary output data (B2, B1, B0) and (B2', B1', B0') of encoders 3 and 28 respectively when supplied with the input signals in normal operation, in which only one of input signals J0 to J7 is data "1". Data group RT2 shows binary output data (B2, B1, B0) provided from encoder 3 in case of multi-addressing.

Figure 18:
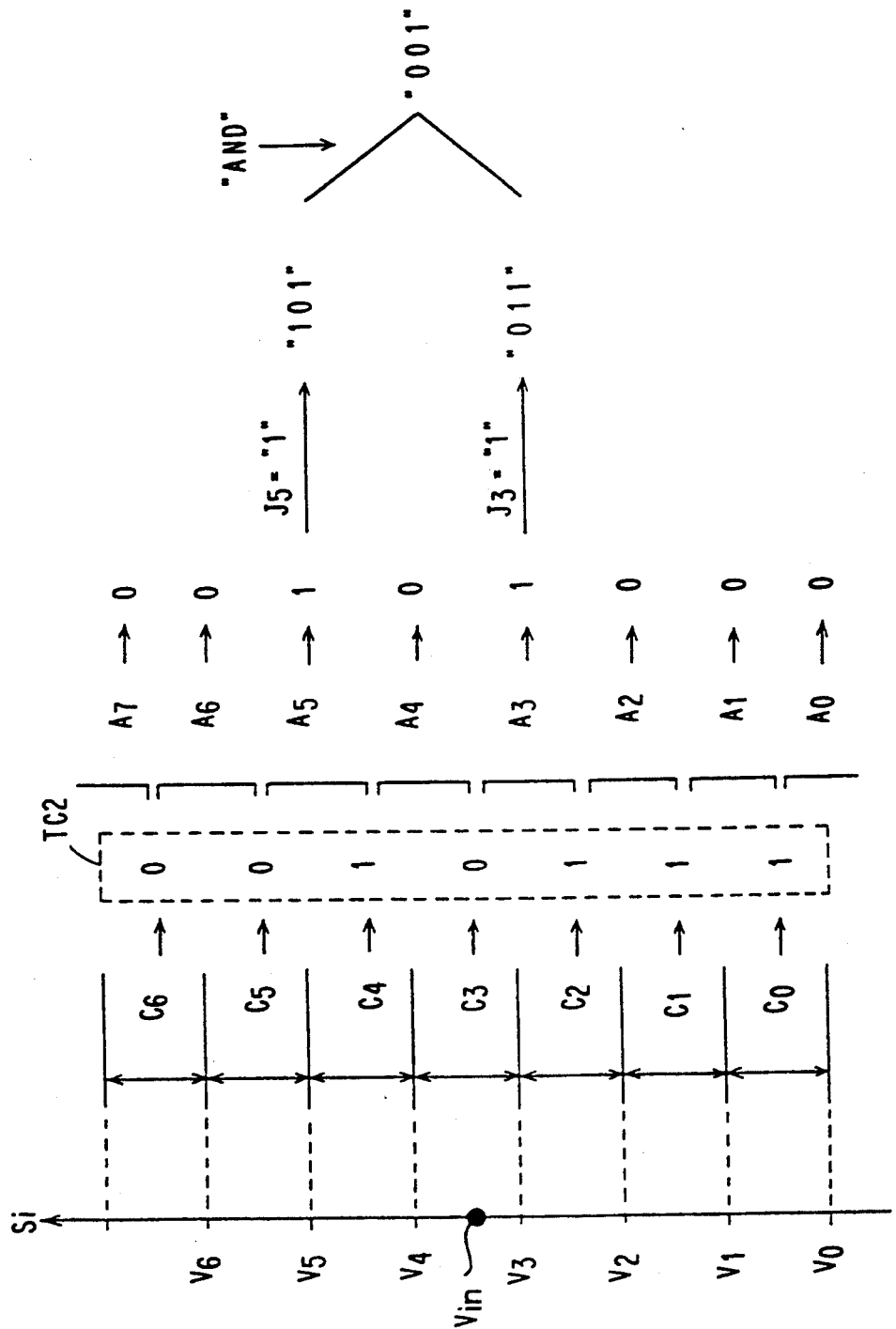
FIG. 18 is a signal transition diagram illustrating an abnormal operation of the encoder 3 shown in FIG. 15.

For example, on the occurrence of multi-addressing, input signals J0 to J7 are applied to encoder 3, in which only signals J3 and J5 are "1". In this case, as can be seen from FIG. 4, encoder 3 provides data (0, 0, 1) in data group RT2 as binary output data (B2, Bl, B0). This binary output data corresponds to a wrong data provided from conventional A/D converter 5a described with reference to FIG. 18. In other words, encoder 3, when supplied with more than two input signals "1", performs logical product ("AND") operation between the corresponding bits of correct binary data corresponding to each other to provide an operation result as shown in data group RT2.

Encoder 28 also operates similarly to encoder 3. Since, in the same example as the foregoing, input signals J0 to J7 are applied, in which only signals J3 to J5 are "1", logical sum ("OR") operation between the corresponding bits of correct data (0, 1, 1) and (1, 0, 1) in normal operation is performed, thus causing data (1, 1, 1) in data group RT5 to be provided as binary output data (B2', B1', B0').

Therefore, in case of multi-addressing, encoder 3 provides one data in data group RT2, while encoder 28 provides one data of data group RT5. In the foregoing example, encoders 3 and 28 provide data (0, 0, 1) and (1, 1, 1), and these data are applied to averaging circuit 29.

Averaging circuit 29 performs average processing for two data applied from encoders 3 and 28. That is, after the addition of applied two data, divide-by-two is performed on added data. In the foregoing example, data (0, 0, 1) and (1, 1, 1) are added, thus added data (1, 0, 0, 0) is obtained. Since LSB of added data is deleted in averaging circuit 29, binary output data shown in data group RT0 are provided from averaging circuit 29. In the example described above, data (1, 0, 0) is provided.

As may be seen from the comparison between data groups RT0 and RT1 or RT1', output data group RT0 is the same as data groups RT1 and RT1' in normal operation. In other words, even in case of multi-addressing, normal binary output data is provided from averaging circuit 29. That is, normal binary converted data D0 to D2 are obtained in A/D converter 5c irrespective of multi-addressing.

Data groups RT2 and RT5 shown in FIG. 4 show each binary output data provided from encoders 3 and 28 respectively when two input signals Jj-1 and Jj+1 of "1" are applied to encoders 3 and 28 in case that only the j-th signal Jj should be "1".

Figure 5:
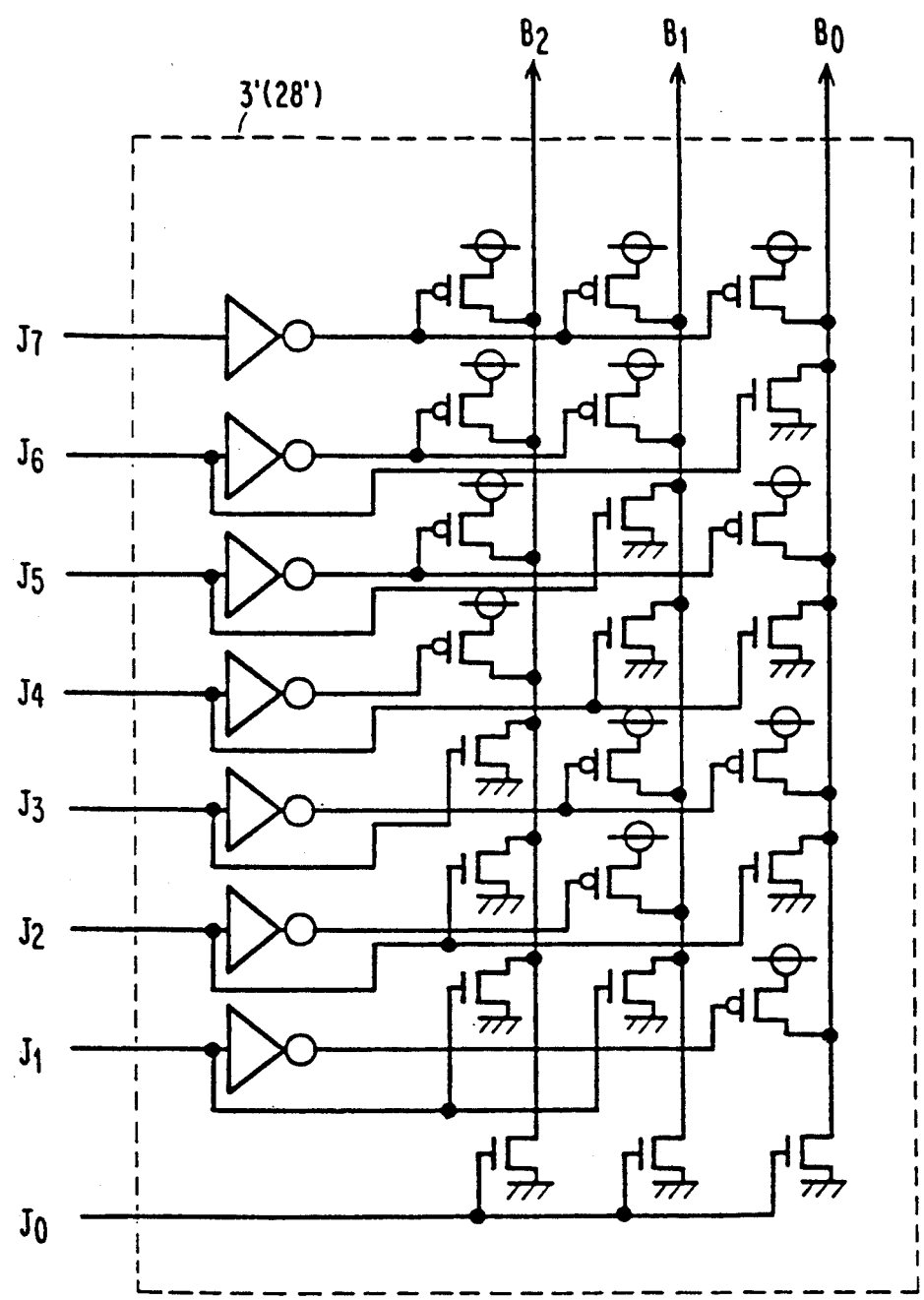
FIG. 5 is a schematic diagram of a circuit of an another encoder applicable as encoder 3 or 28 shown in FIG. 1.

FIG. 5 is a circuit diagram of another encoder applicable as encoders 3 and 28 shown in FIG. 1. Encoders 3 and 28 shown in FIG. 1 have circuit configurations different from each other as shown in FIG. 16 and FIG. 2. Encoder 3' and 28' shown in FIG. 5 have the same circuit configuration, however they can be applied to both encoders 3 and 28. However, in encoders 3' and 28', current driving ability (mutual conductance gm) of PMOS transistors is different from that of NMOS transistors as in the following.

In case that a circuit shown in FIG. 5 is employed as encoder 3', current driving ability of NMOS transistors is set to larger than that of PMOS transistors. On the other hand, in case that the circuit shown in FIG. 5 is employed as encoder 28', current driving ability of NMOS transistors is set to smaller than that of PMOS transistors. Setting current driving ability as described above allows the circuit shown in FIG. 5 to be used as encoders 3 and 28 shown in FIG. 1.

Figure 6:
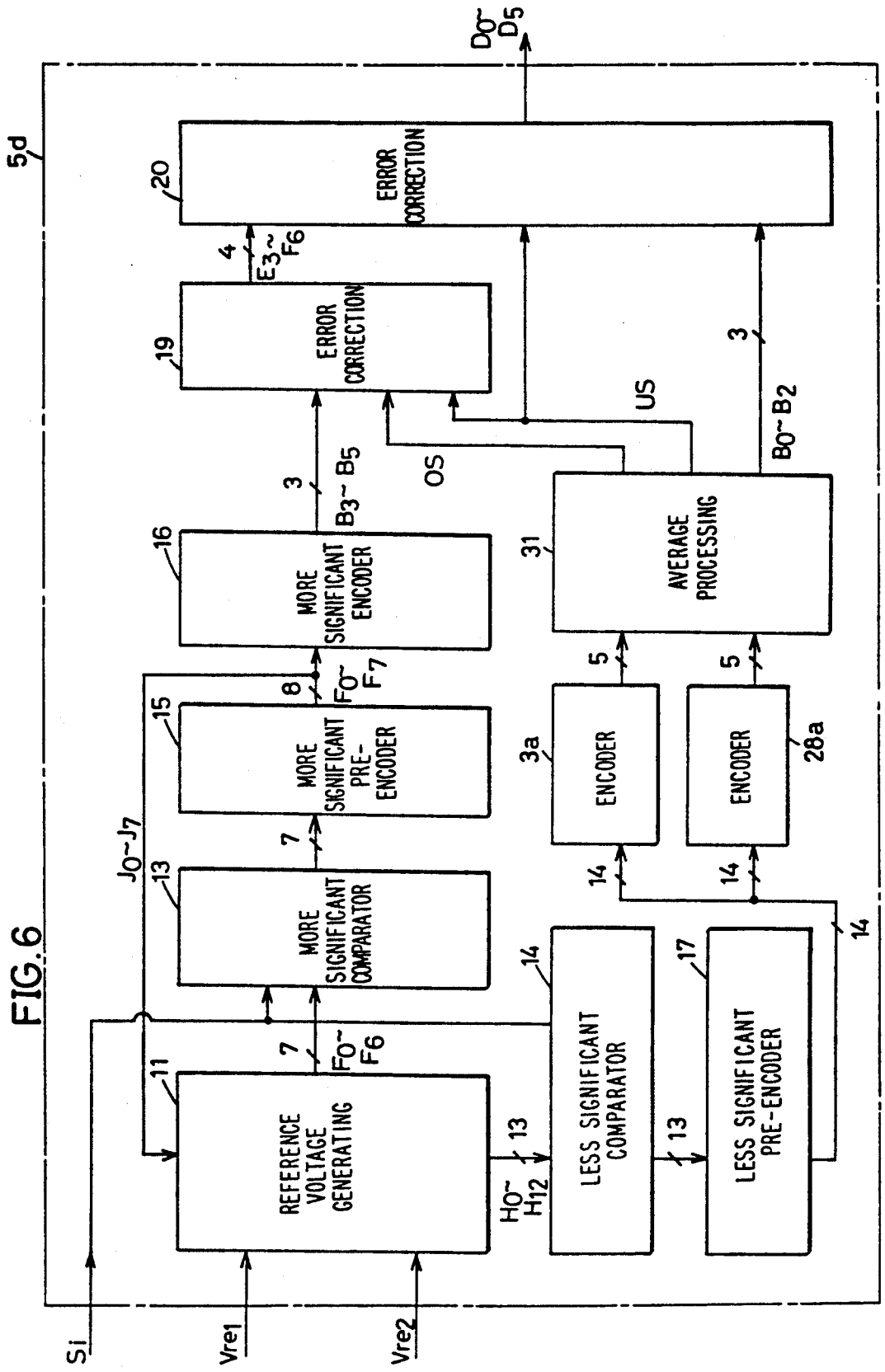
FIG. 6 is a block diagram of a circuit of a serial-parallel type A/D converter showing an another embodiment of the present invention.
Figure 19:
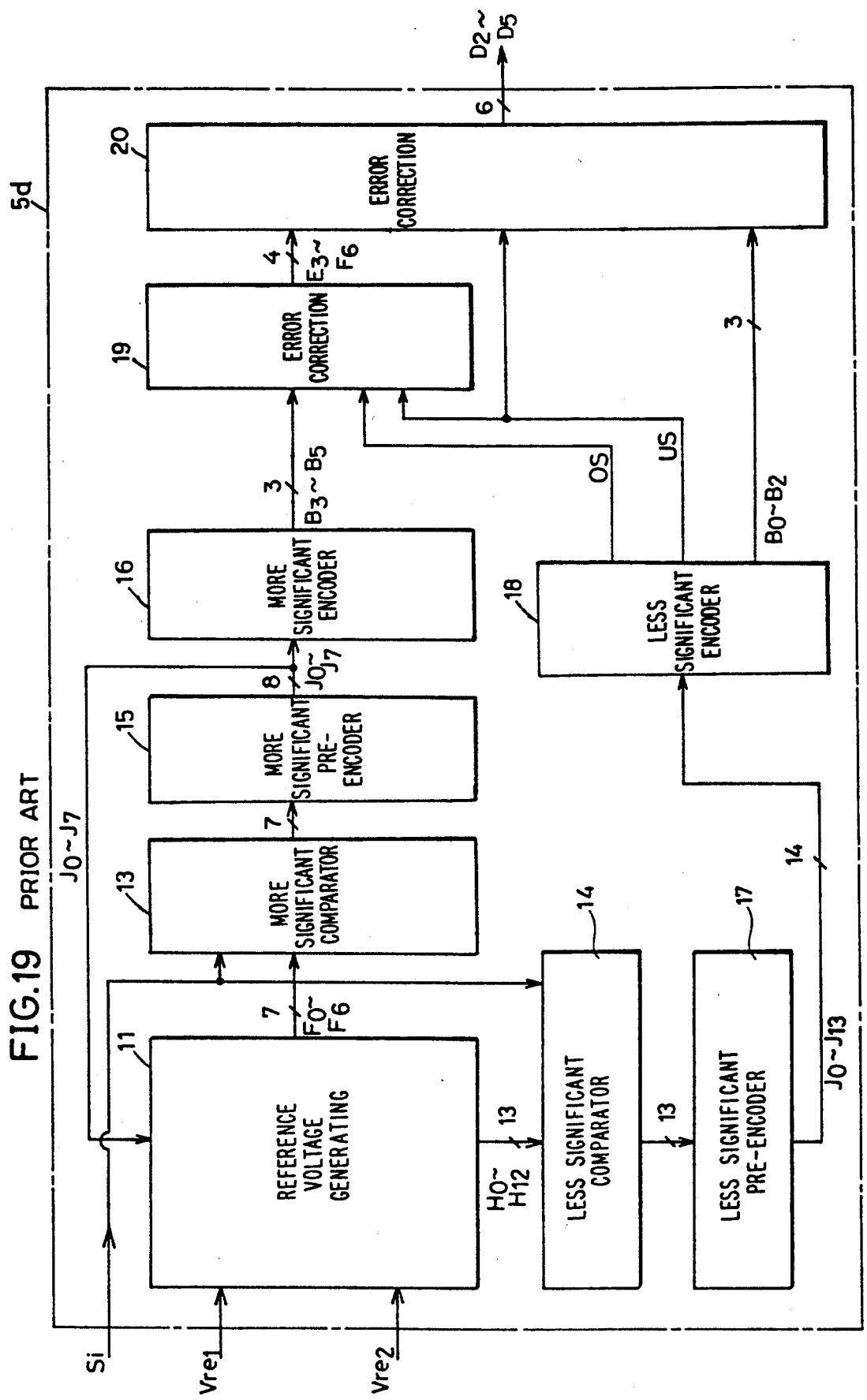
FIG. 19 is a block diagram of a circuit of conventional serial-parallel type A/D converter.
Figure 20:
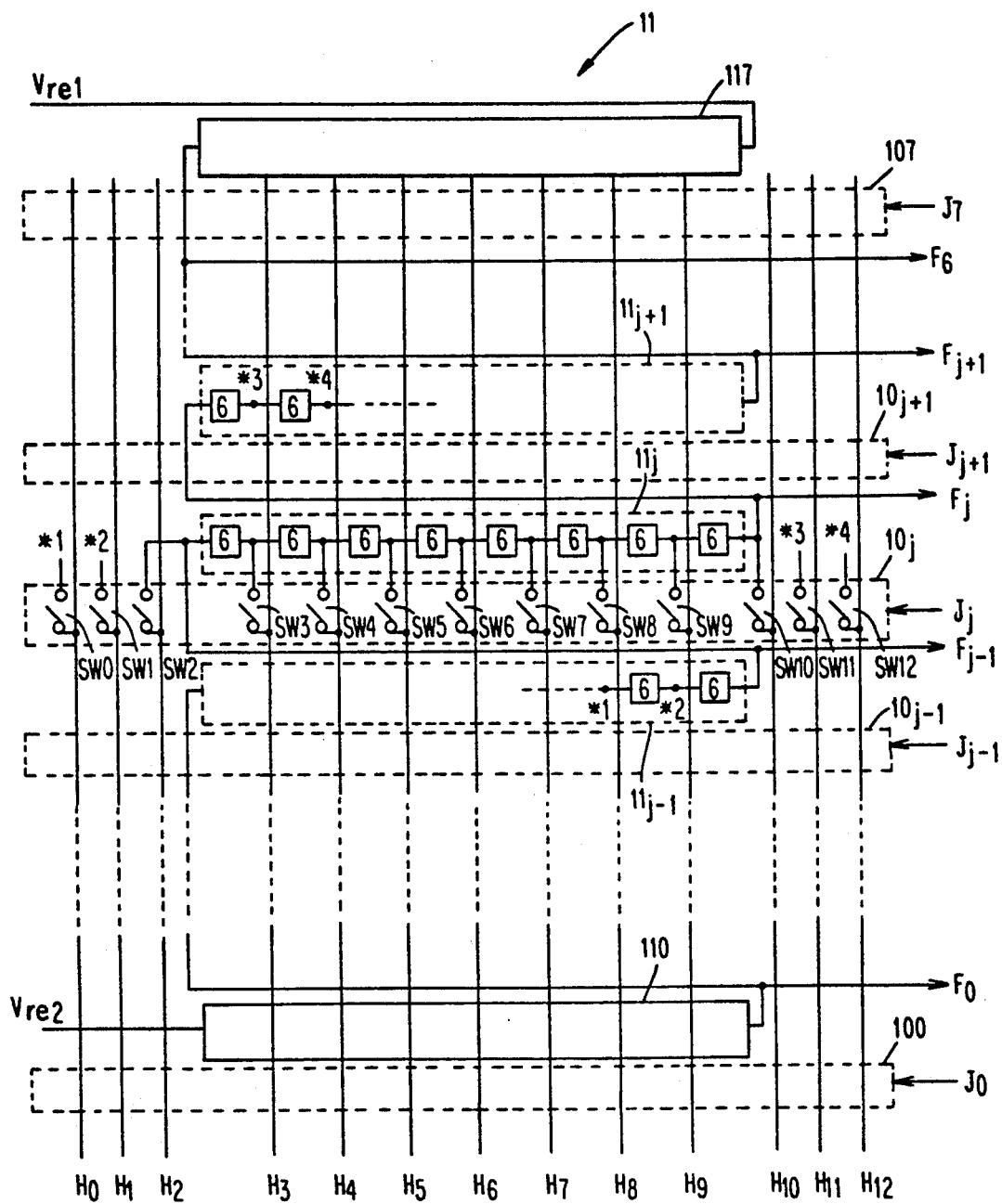
FIG. 20 is a schematic diagram of a reference voltage generating circuit 11 shown in FIG. 19.
Figure 21:
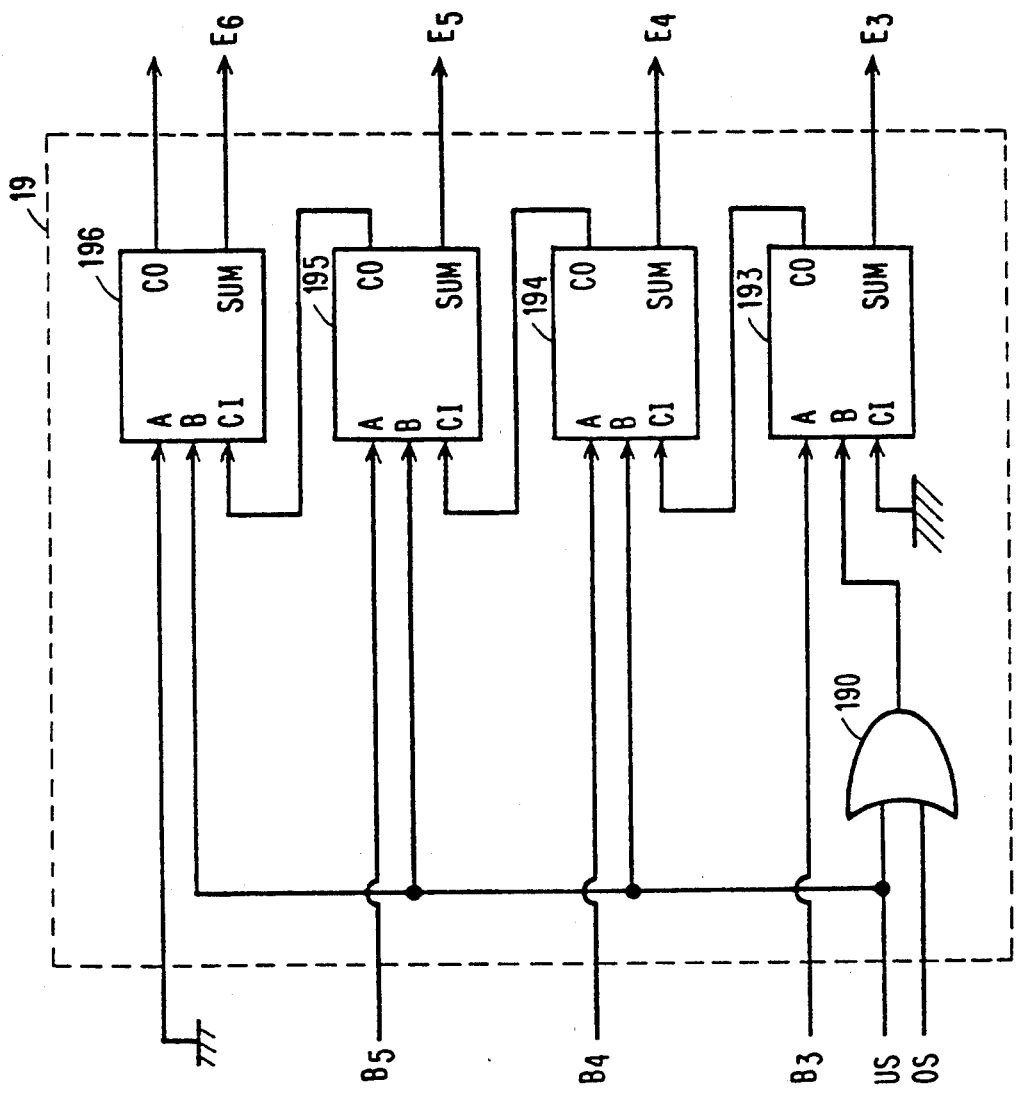
FIG. 21 is a block diagram of an error correction circuit 19 shown in FIG. 19.
Figure 22:
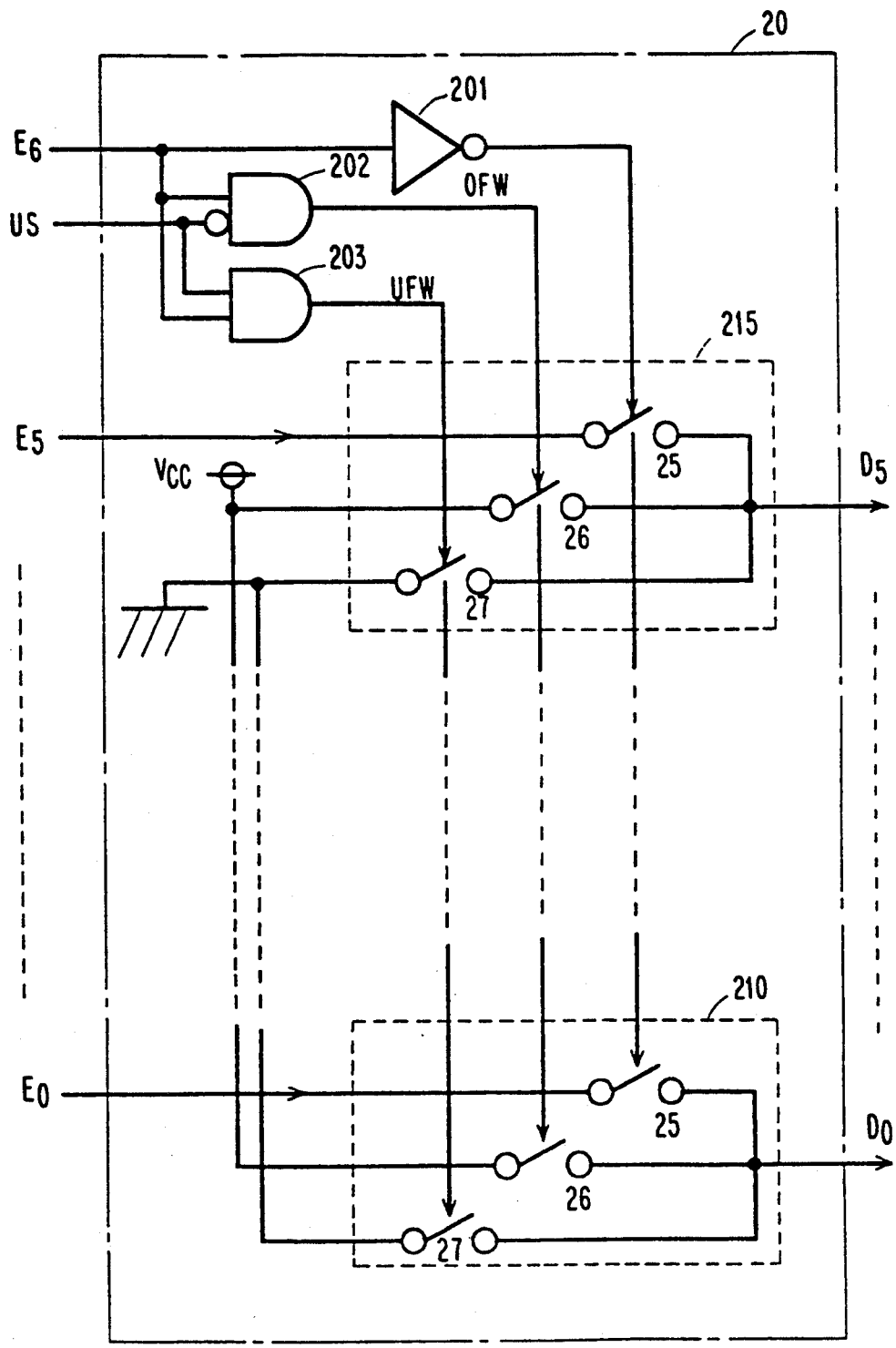
FIG. 22 is a block diagram of an error correction circuit 20 shown in FIG. 19.

A serial-parallel type A/D converter 5d showing another embodiment of the invention is shown in FIG. 6. In comparison with conventional serial-parallel type A/D converter 5b shown in FIG. 19, A/D converter 5d in FIG. 6 is provided with encoders 3a and 28a, and an averaging circuit 31 in place of less significant encoder 18. Since other circuit configurations are similar to those in FIG. 19, explanation is not repeated. Encoder 3a is composed of pseudo-NMOS type ROM in the same manner as less significant encoder 18 shown in FIG. 19. Encoder 28a is implemented by pseudo-PMOS type ROM. Encoders 3a and 28a are pointed out to have circuit configurations similar to those of encoders 3 and 28 shown in FIG. 16 and FIG. 2, respectively. Averaging circuit 31 is also pointed out to have a circuit configuration similar to that of averaging circuit 29 shown in FIG. 3.

Figure 24:
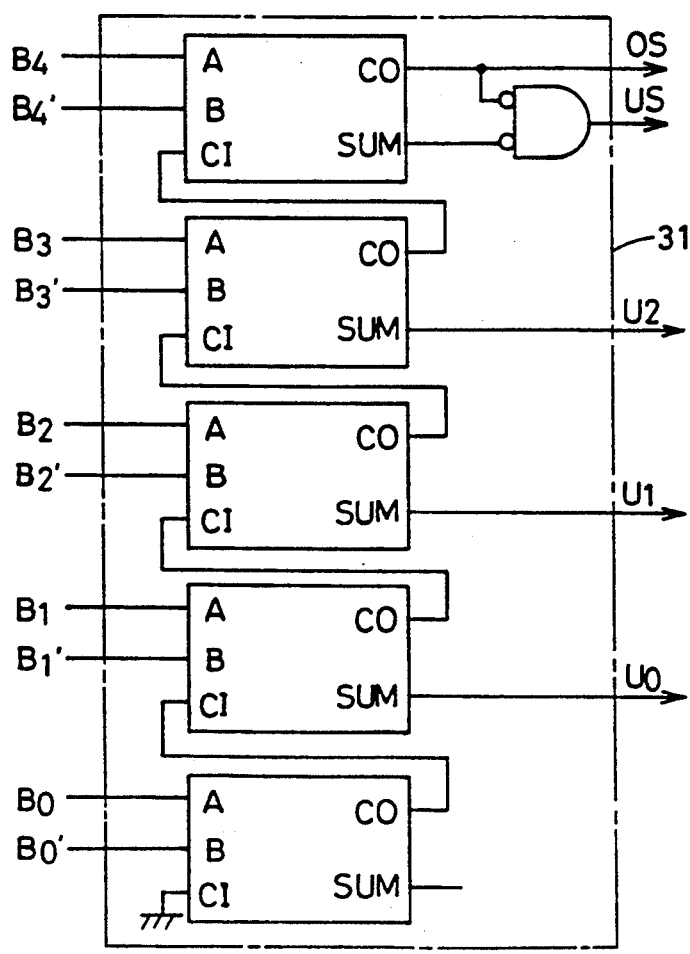
FIG. 24 is a schematic diagram of an averaging circuit 31 shown in FIG. 6.

FIG. 24 is a schematic diagram of averaging circuit 31 shown in FIG. 6. Referring to FIG. 24, signals B0 to B4 are provided from encoder 3a shown in FIG. 6, and signals B0' to B4' are provided from encoder 28a. Averaging circuit 31 provides the output signal OS of "1" when overscale is caused in A/D conversion of less significant bits. In case of underscale in A/D conversion of less significant bits, averaging circuit 31 provides the output signal US of "1".

Also, in A/D converter 5d shown in FIG. 6, encoders 3a, 28a and averaging circuit 31 basically operate in the same manner as encoders 3 and 28, and averaging circuit 29 in the embodiment shown in FIG. 1. The following Table 3 shows a signal transition in A/D converter 5d.

TABLE 3

|  | RT3 | RT4 | RT7 | RT8 |
|---|---|---|---|---|
| $J_{13}$ | 10010 | 10010 | 10010 | 100100 |
| $J_{12}$ | 10001 | 10000 | 10010 | 100010 |
| $J_{11}$ | 10000 | 00001 | 11111 | 100000 |
| $J_{10}$ | 01111 | 00000 | 11110 | 011110 |
| $J_9$ | 01110 | 01101 | 01111 | 011100 |
| $J_8$ | 01101 | 01100 | 01110 | 011010 |
| $J_7$ | 01100 | 01001 | 01111 | 011000 |
| $J_6$ | 01011 | 01000 | 01110 | 010110 |
| $J_5$ | 01010 | 01001 | 01011 | 010100 |
| $J_4$ | 01001 | 01000 | 01010 | 010010 |
| $J_3$ | 01000 | 00001 | 01111 | 010000 |
| $J_2$ | 00111 | 00000 | 01110 | 001110 |
| $J_1$ | 00110 | 00101 | 00111 | 001100 |
| $J_0$ | 00101 | 00101 | 00101 | 001010 |

Data group RT3 shows binary output data having 5 bits (MSB is leftmost) provided from encoders 3a and 28a when input signals J0 to J13 in normal operation are applied to encoders 3a and 28a. Data group RT4 shows binary data having 5 bits (MSB is leftmost) which encoder 3a provides in case of multi-addressing. That is, though only the j-th input signal Jj should be "1", encoder 3a provides data shown in data group RT4 when supplied with input signals Jj-1 and Jj+1 of "1". Each data shown in data group RT4 corresponds to a logical product ("AND") of j-1st and j+1st data in data group RT3.

Likewise, data group RT7 shows binary data having 5 bits (MSB is leftmost) provided from encoder 28a in case of multi-addressing. The j-th data in data group RT7 is pointed out to be obtained by a logical sum of j-1st and j+1st data in data group RT3.

Data group RT8 shows an add result of corresponding data in data groups RT4 and RT7. That is, the j-th data in data group RT8 is obtained by the addition of each of j-th data in data groups RT4 and RT7. Correct data which is not affected by the generation of multi-addressing is obtained by deleting LSB of each data in data group RT8. It can clearly be seen from the fact that more significant 5 bits in data group RT8 corresponds to data group RT3.

As shown in FIG. 6, encoders 3a and 28a provide binary output data of 5 bits. On the occurrence of overscale, the most significant bit OS becomes "1". On the occurrence of underscale, both of the most significant bit OS and the second from the most significant bit US become "0". Averaging circuit 31 is composed of six full adders and average value data is obtained by deleting the least significant bit of the data provided from six full adders. Among the average value data of 5 bits, more significant 2 bits are employed for error correction in circuits 19 and 20. Less significant 3 bits, B0 to B2 are used as less significant bits in A/D conversion.

In A/D converter 5d shown in FIG. 6, encoders 3a and 28a of 5-bit configuration are employed. In addition to this, encoder of 4-bit configuration is also available.

Figure 7:
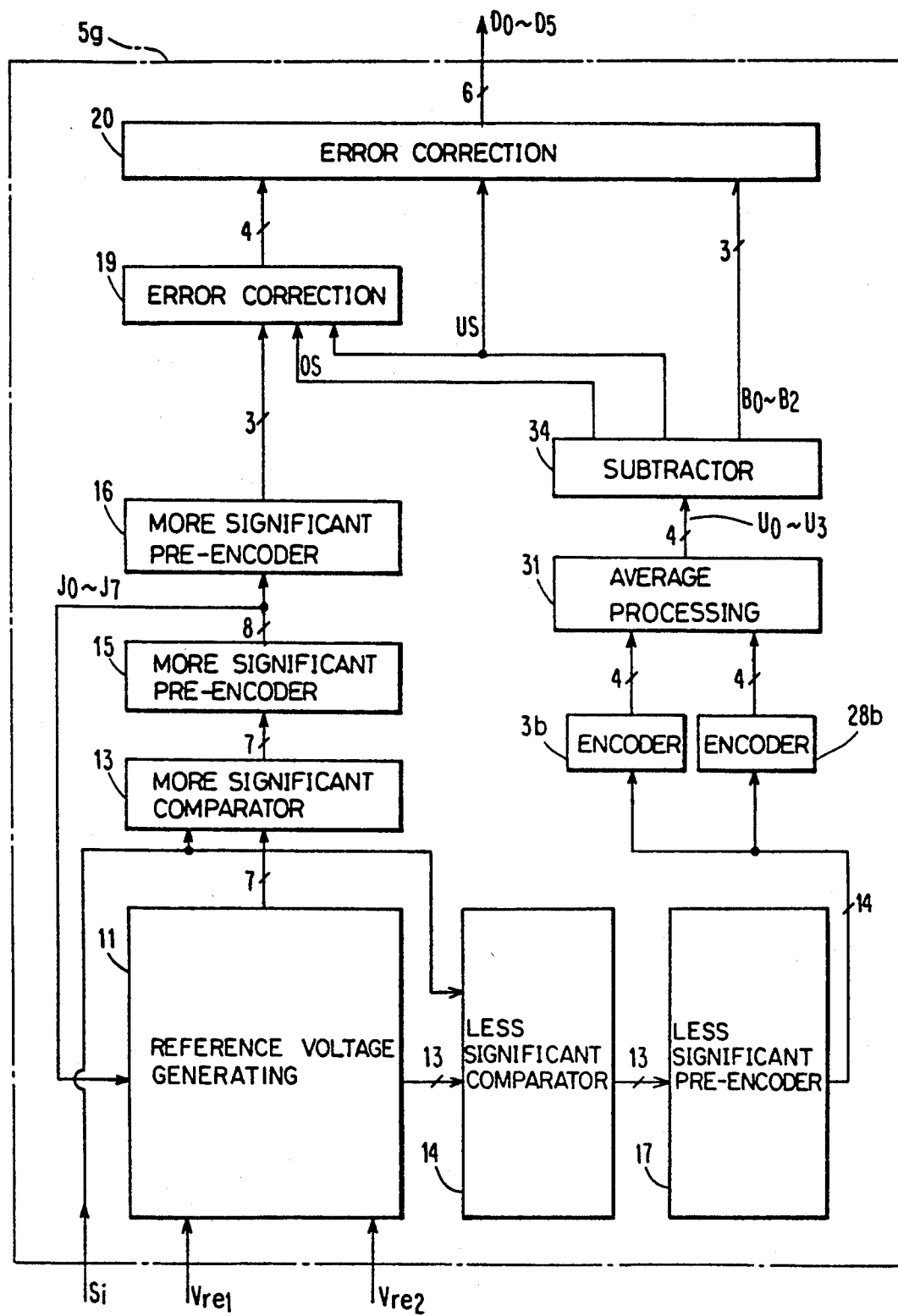
FIG. 7 is a block diagram of a circuit of a serial-parallel type A/D converter showing yet another embodiment of the present invention.

A serial-parallel type A/D converter showing still another example of the present invention is shown in FIG. 7. Compared to A/D converter 5d shown in FIG. 6, an A/D converter 5g shown in FIG. 7 is provided with encoders 3b and 28b of 4-bit configuration instead of encoders 3a and 28a of 5-bit configuration. In addition to this, A/D converter 5g is further provided with a subtracter circuit 34 connected to the outputs of averaging circuit 31. Since encoders 3b and 28b of 4-bit configuration are employed in A/D converter 5g, the coding shown in the foregoing Table 3 is altered as in the following Table 4.

TABLE 4

|  | RT3' | RT4' | RT7' | RT8' | RT9 | RT9' |
|---|---|---|---|---|---|---|
| $J_{13}$ | 1101 | 1101 | 1101 | 11010 | 01010 | 11010 |
| $J_{12}$ | 1100 | 1001 | 1111 | 11000 | 01001 | 11001 |
| $J_{11}$ | 1011 | 1000 | 1110 | 10110 | 01000 | 11000 |
| $J_{10}$ | 1010 | 1001 | 1011 | 10100 | 00111 | 10111 |
| $J_9$ | 1001 | 1000 | 1010 | 10010 | 00110 | 10110 |
| $J_8$ | 1000 | 0001 | 1111 | 10000 | 00101 | 10101 |
| $J_7$ | 0111 | 0000 | 1110 | 01110 | 00100 | 10100 |
| $J_6$ | 0110 | 0101 | 0111 | 01100 | 00011 | 10011 |
| $J_5$ | 0101 | 0100 | 0110 | 01010 | 00010 | 10010 |
| $J_4$ | 0100 | 0001 | 0111 | 01000 | 00001 | 10001 |
| $J_3$ | 0011 | 0000 | 0110 | 00110 | 00000 | 10000 |
| $J_2$ | 0010 | 0001 | 0011 | 00100 | 11111 | 01111 |
| $J_1$ | 0001 | 0000 | 0010 | 00010 | 11110 | 01110 |
| $J_0$ | 0000 | 0000 | 0000 | 00000 | 11101 | 01101 |

Each of the data groups RT3', RT4', RT7', and RT8' corresponds to data groups RT3, RT4, RT7 and RT8 shown in Table 3, respectively. That is, data group RT3 shows the data provided from encoders 3b and 28b in normal operation. Data group RT4' shows the data provided from encoder 3a in case of multi-addressing. Data group RT7' shows the data provided from encoder 28b in case of multi-addressing. Data group RT8' shows the data that the addition was made thereto in average processing.

As shown in the data group RT3' shown in FIG. 4, when input signals J0 to J13 are provided in the coding shown in FIG. 4, in which only signal J0 is "1", encoders 3b and 28b provide data (0, 0, 0, 0). However, when input signals J0 to J13 are provided, in which only signal J3 is "1", data (0, 0, 0, 0) should preferably be provided from encoders 3b and 28b. To subtract the difference between two data, i.e., binary data "11", subtracter circuit 34 is provided. The subtraction of binary data "11" corresponds to the performance of an addition of binary data "1101".

Figure 8:
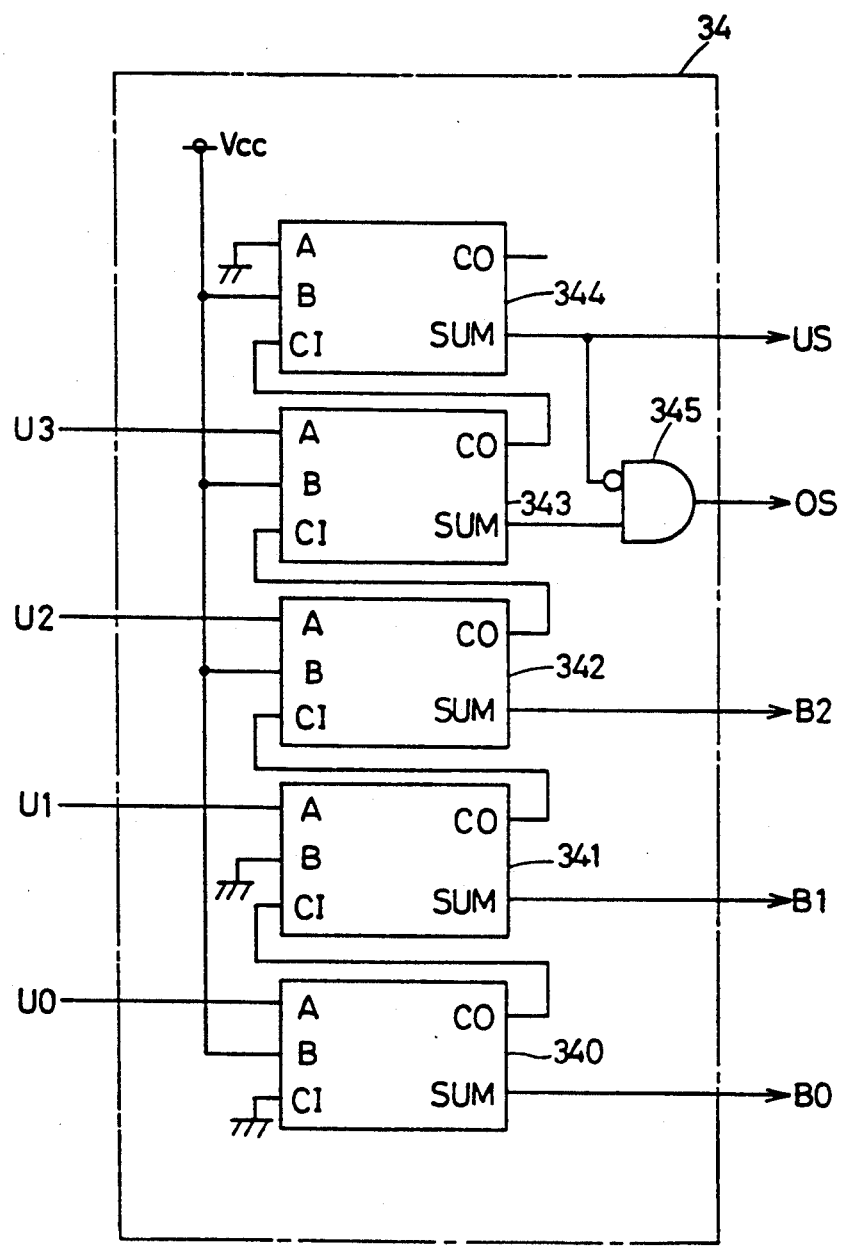
FIG. 8 is a schematic diagram of a subtracter circuit 34 shown in FIG. 7.

The details of subtracter circuit 34 are shown in FIG. 8. Subtracter circuit 34 includes four full adders 340 to 344 and AND gate 345. Output signals U0 to U3 provided from averaging circuit 31 are applied to each of input terminals A of full adders 340 to 343, respectively. Negative data bit "11101" of binary data "11" is applied to each of input terminals B of full adders 344 to 340, respectively. Binary data B0 to B2 are provided through each of sum output terminals SUM of full adders 340 to 342. Full scale signal US is provided through terminal CO of full adder 343. AND gate 345 connected to sum output terminal SUM and terminal CO of full adder 343 provides overscale signal OS.

Data group RT9 shown in Table 4 shows output signals (the signal US is leftmost) provided from subtracter circuit 34. Each data in data group RT9 is obtained by subtracting binary data "11" from corresponding data in data group RT8.

Figure 25:
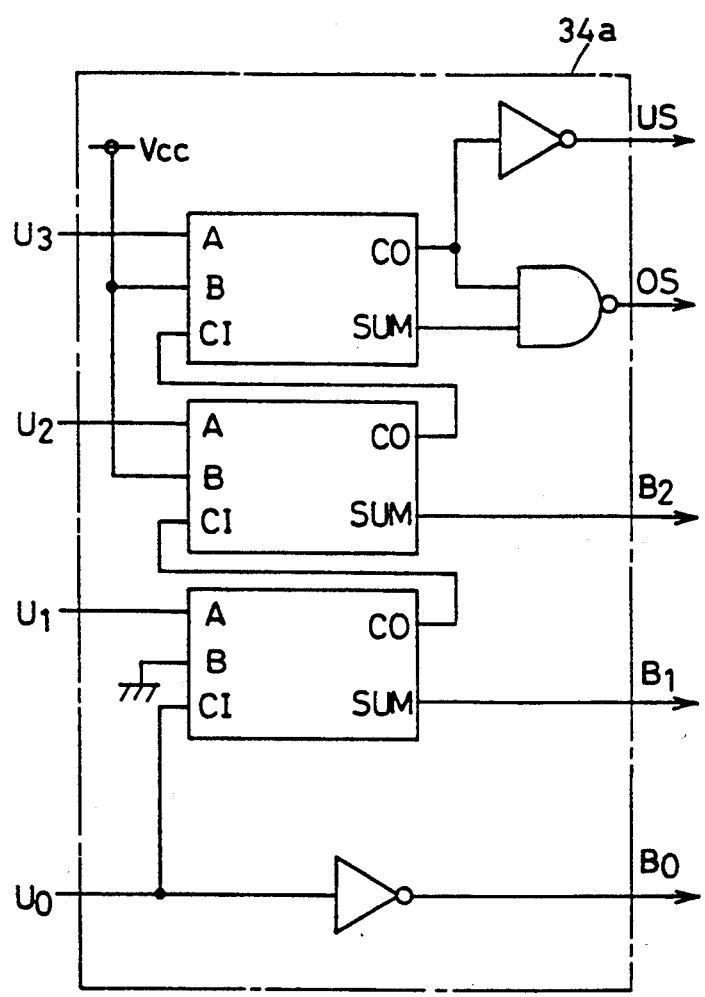
FIG. 25 is a schematic diagram of a circuit showing another example of the subtracter 34 of FIG. 7.
Figure 26:
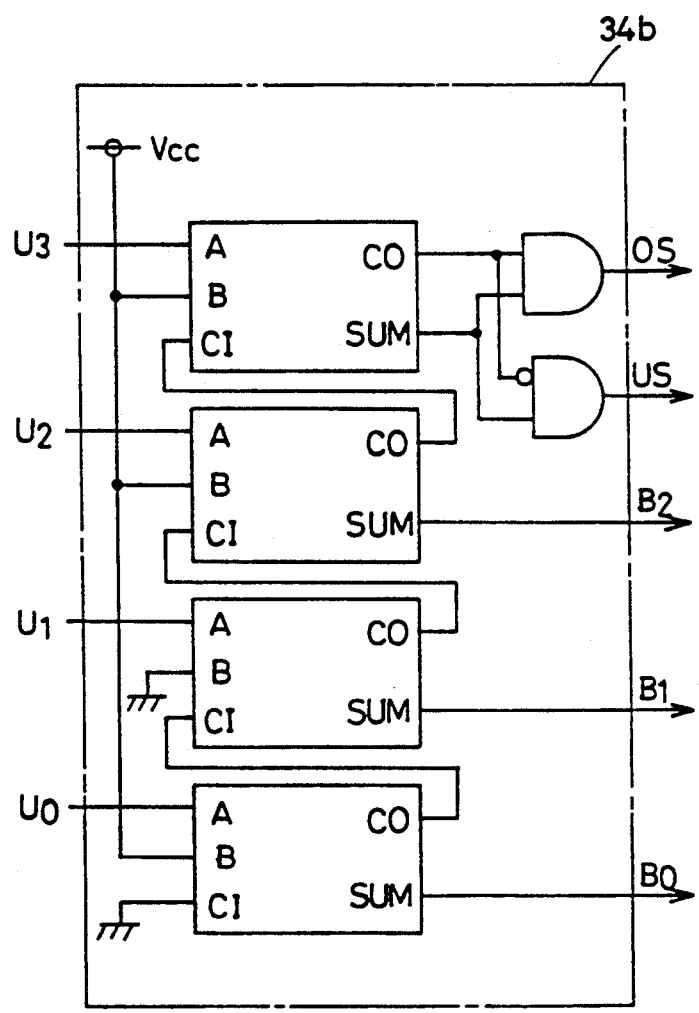
FIG. 26 is a schematic diagram of a circuit showing still another example of the subtracter 34 of FIG. 7.
Figure 27:
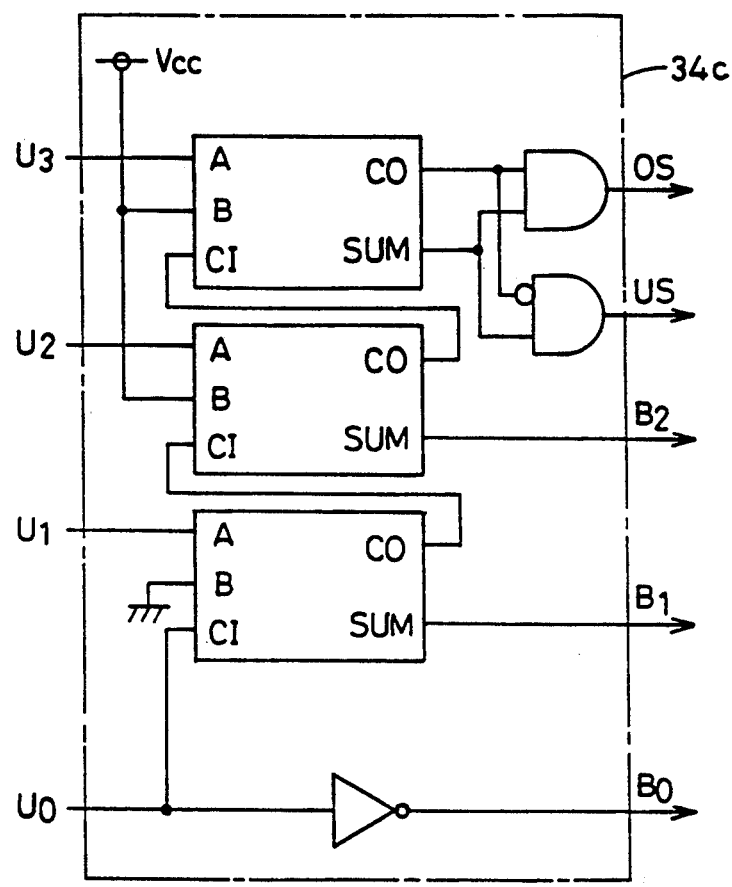
FIG. 27 is a schematic diagram of a circuit showing yet another example of the subtracter 34 of FIG. 7.
Figure 28:
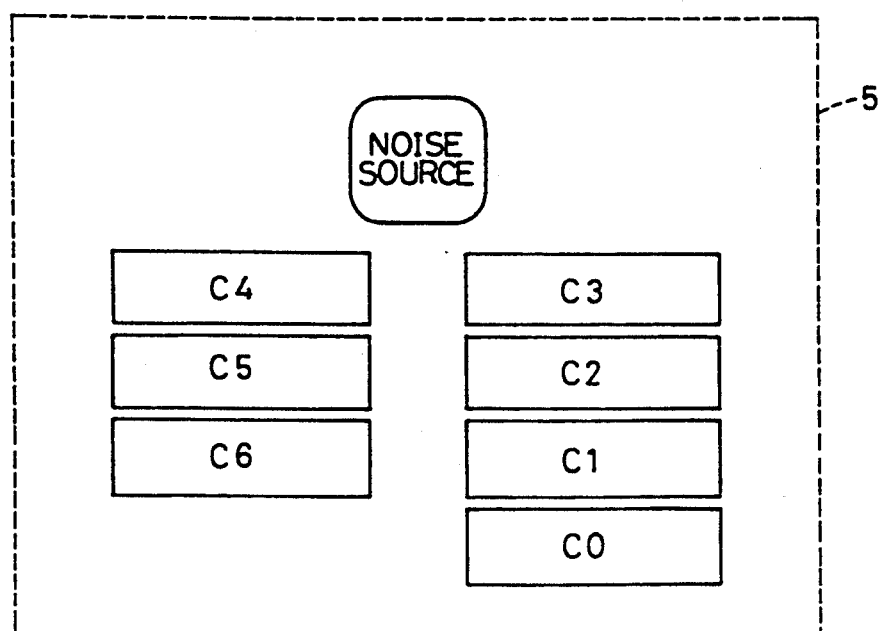
FIG. 28 is a layout on a semiconductor substrate showing an occurrence of analog noise.
Figure 29:
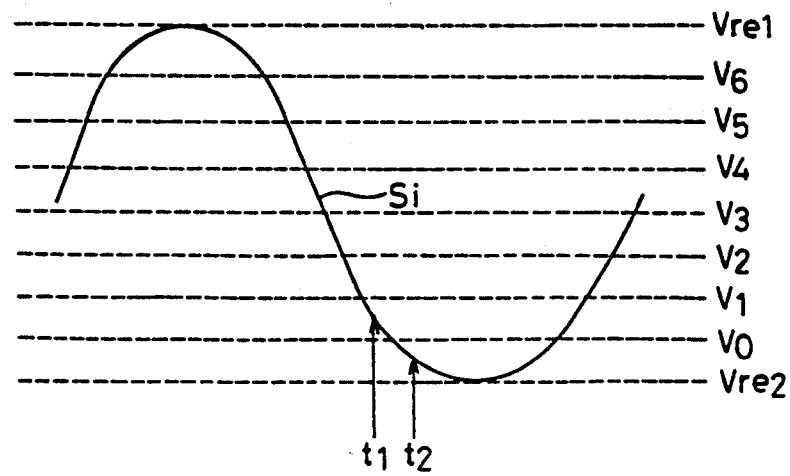
FIG. 29 is a waveform chart of an input signal showing the occurrence of multi-addressing.
Figure 30A:
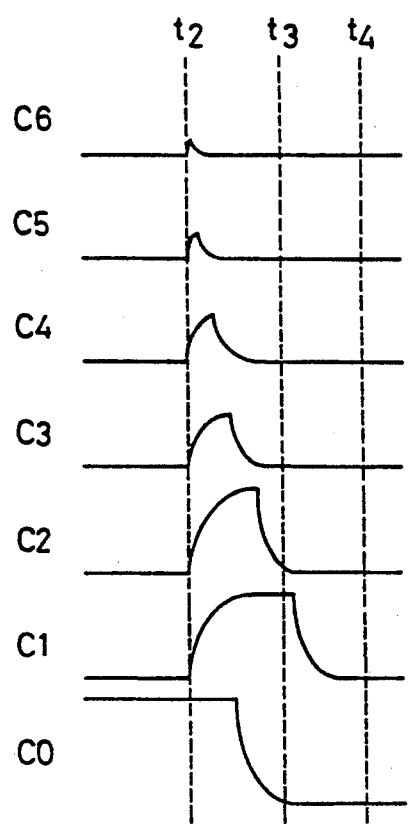
FIG. 30A is a timing chart showing the occurrence of multi-addressing.
Figures 30B, 30C:
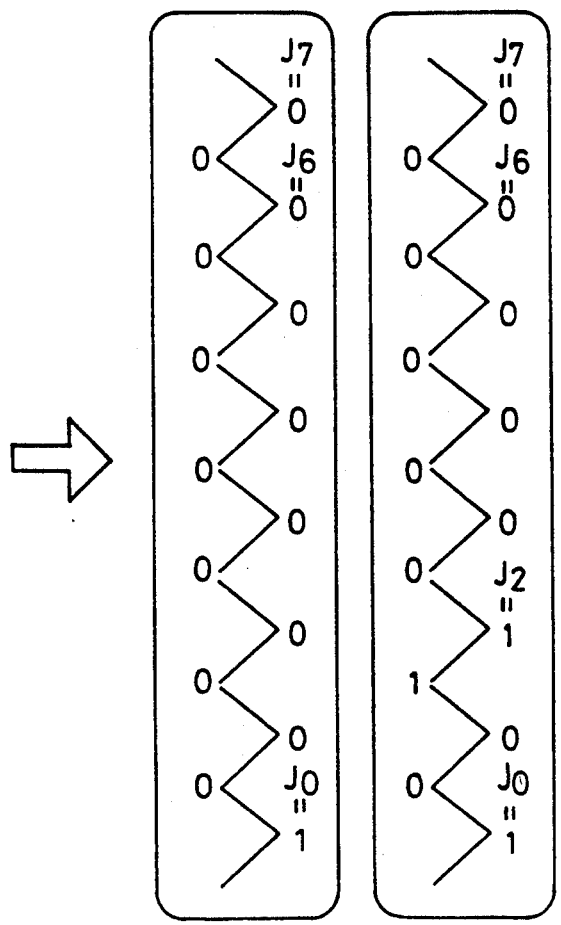
FIGS. 30B and 30C are signal transition diagrams showing the occurrence of multi-addressing.
Figure 31:
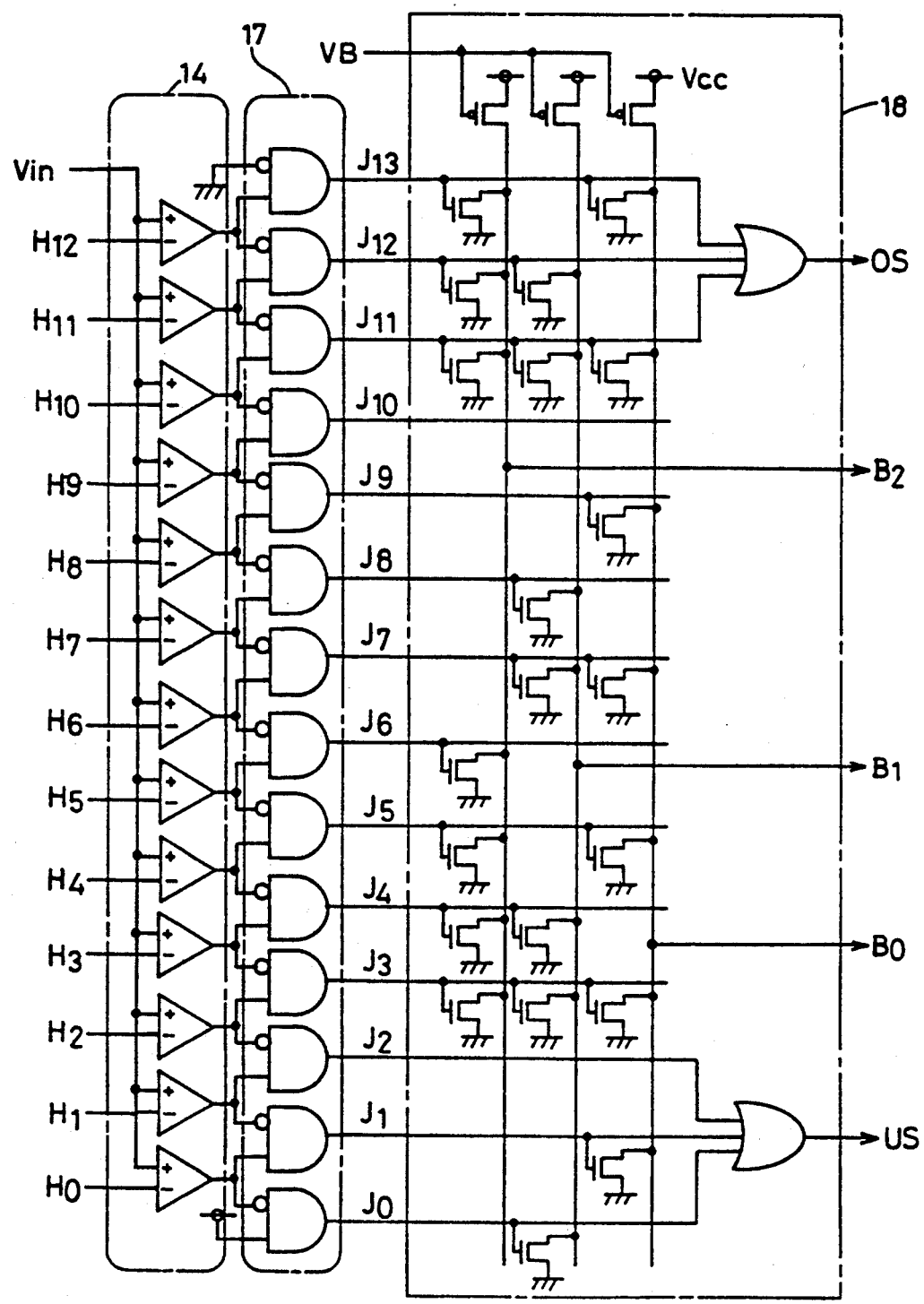
FIG. 31 is a schematic diagram of a circuit of a less significant comparator 14, a less significant pre-encoder 17 and a less significant encoder 18 shown in FIG. 19.

Subtracter circuit 34 shown in FIG. 8 can be simplified as shown in FIG. 25. FIG. 25 is a schematic diagram of a simplified subtracter circuit 34a applicable as subtracter 34 shown in FIG. 7. In addition, subtracter circuits 34b and 34c shown in FIGS. 26 and 27 are also applicable as subtracter 34 shown in FIG. 7. When subtracter circuit 34b shown in FIG. 26 is employed, subtracter circuit 34b provides output signals in data group RT9' shown in table 4.

Figure 9:
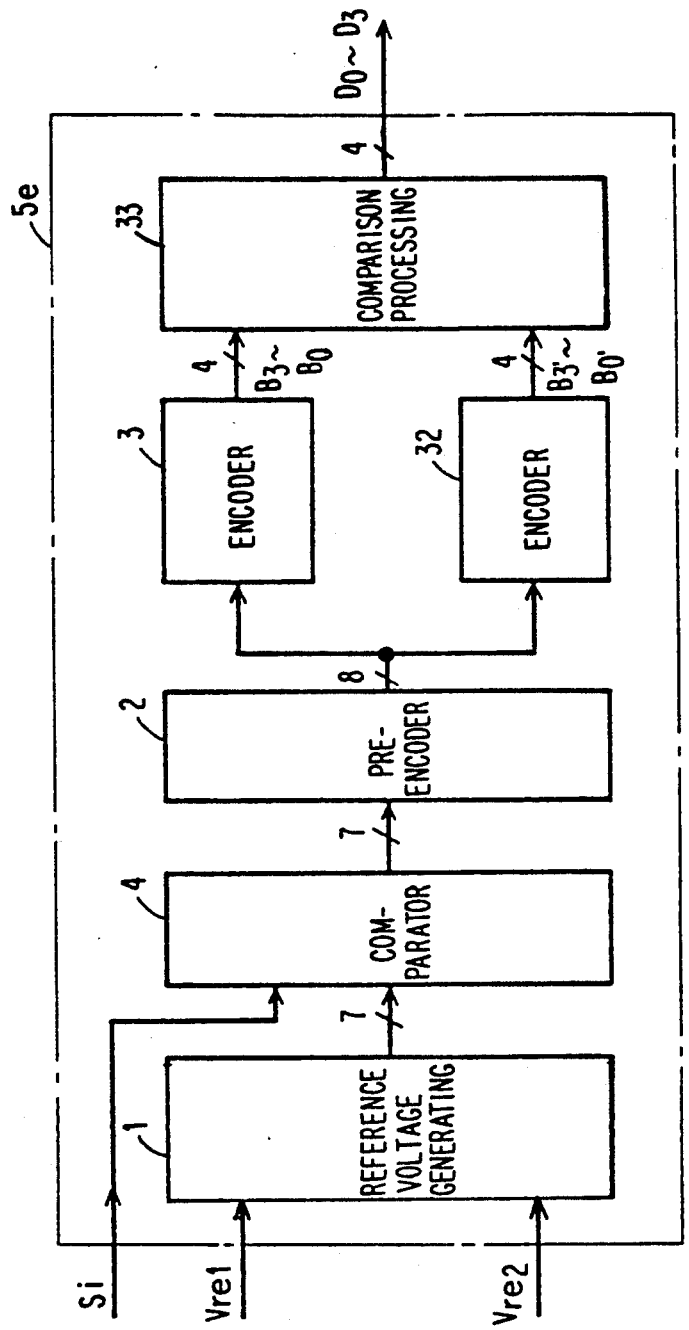
FIG. 9 is a block diagram of a circuit of a parallel-type A/D converter showing still another embodiment of the present invention.

A parallel-type A/D converter 5e showing yet another embodiment of the present invention is shown in FIG. 9. Compared to A/D converter 5a shown in FIG. 1, A/D converter 5e shown in FIG. 9 is provided with an encoder 32 and a comparison processing circuit 33 instead of encoder 28 and averaging circuit 29. Encoder 32 is implemented by pseudo-NMOS type ROM having the coding different from that of encoder 3. Comparison processing circuit 33 compares data provided from encoders 3 and 32 to selectively provide the larger data as binary-converted output data D0 to D3. The signal transition in A/D converter 5e is shown in the following Table 5.

TABLE 5

|  | RT1 | RT10 | RT11 | RT12 | RT13 |
|---|---|---|---|---|---|
| $J_{15}$ | 111 | 1101 | 1111 | 1100 | 1111 |
| $J_{14}$ | 1110 | 1100 | 1101 | 1001 | 1101 |
| $J_{13}$ | 1101 | 1011 | 1100 | 1000 | 1100 |
| $J_{12}$ | 1100 | 1010 | 1001 | 1001 | 1001 |
| $J_{11}$ | 1011 | 1001 | 1000 | 1000 | 1000 |
| $J_{10}$ | 1010 | 1000 | 1001 | 0001 | 1001 |
| $J_9$ | 1001 | 0111 | 1000 | 0000 | 1000 |
| $J_8$ | 1000 | 0110 | 0001 | 0101 | 0101 |
| $J_7$ | 0111 | 0101 | 0000 | 0100 | 0100 |
| $J_6$ | 0110 | 0100 | 0101 | 0001 | 0101 |
| $J_5$ | 0101 | 0011 | 0100 | 0000 | 0100 |
| $J_4$ | 0100 | 0010 | 0001 | 0001 | 0001 |
| $J_3$ | 0011 | 0001 | 0000 | 0000 | 0000 |
| $J_2$ | 0000 | 0000 | 0000 | 0000 | 1101 |
| $J_1$ | 0001 | 0000 | 0000 | 0000 | 0000 |
| $J_0$ | 0000 | 0000 | 0000 | 0000 | 0000 |

Data group RT1 shown in Table 5 shows the data provided from encoder 3 in normal operation. Data group RT10 shows the data provided from encoder 32 in normal operation. The coding in encoder 32 is obtained by the coding in encoder 3, that is, by subtracting binary data "11" from each data in data group RT1. In other words, pseudo-NMOS type ROM designed on the basis of such coding is employed as encoder 32.

Data group RT11 shows the data provided from encoder 3 in case of multi-addressing. Likewise, data group RT12 shows the data provided from encoder 32 in case of multi-addressing. Furthermore, data group RT13 shows the data provided from comparison processing circuit 33 in case of multi-addressing. That is, the j-th data in data group RT13 is the larger one of each of j-th data in data groups RT11 and RT12.

Figure 10:
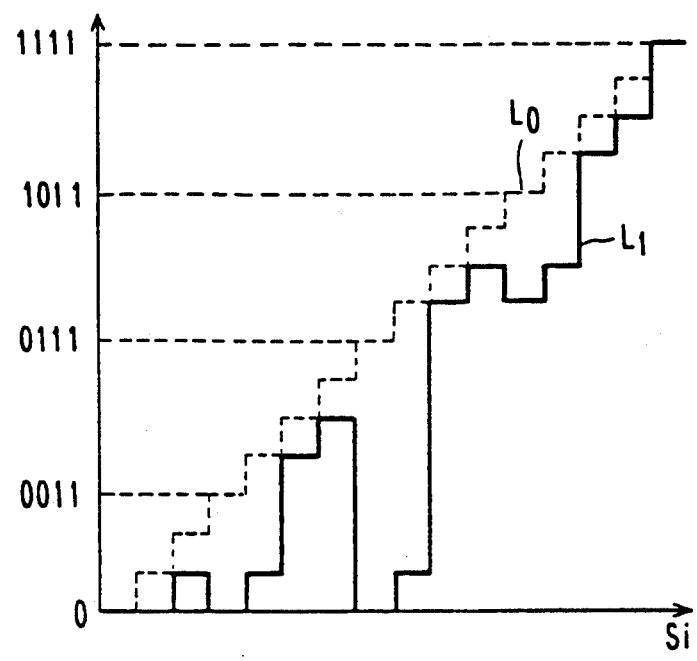
FIG. 10 is a graph showing the change of the output data of an encoder 3 shown in FIG. 9.

The output data of encoder 3 shown in FIG. 9 is responsive to analog input signal Si to change as shown in FIG. 10. Referring to FIG. 10, a quadrature axis indicates the potential of analog input signal Si, while a longitudinal axis indicates the output data of encoder 3. A dashed line L0 indicates binary converted data to be provided in normal operation. A solid line L1 indicates the output data provided from encoder 3 shown in FIG. 9 in case of multi-addressing. As can be seen from FIG. 10, encoder 3 may provide data L1 greatly different from the desired data L0, in case of multi-addressing.

Figure 11:
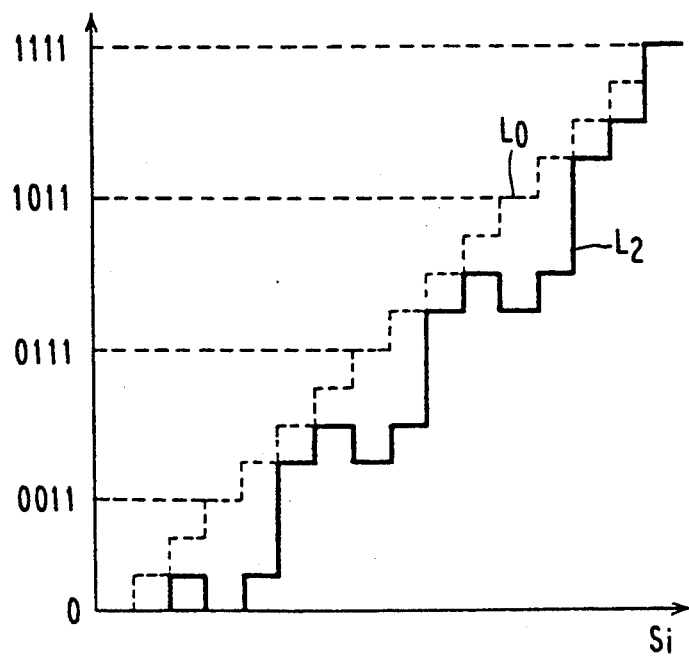
FIG. 11 is a graph showing the change of the output data of a comparison processing circuit 33 shown in FIG. 9.

The output data of comparison processing circuit 33 shown in FIG. 9 changes as indicated by a solid line L2 in FIG. 11. As can be seen from FIG. 11, even in case of multi-addressing, output data L2 provided from comparison processing circuit 33 is not so greatly different from data L0 in normal operation. This means that A/D converter 5e shown in FIG. 9 doesn't provide data greatly different from the desired one in case of multi-addressing.

Figure 12:
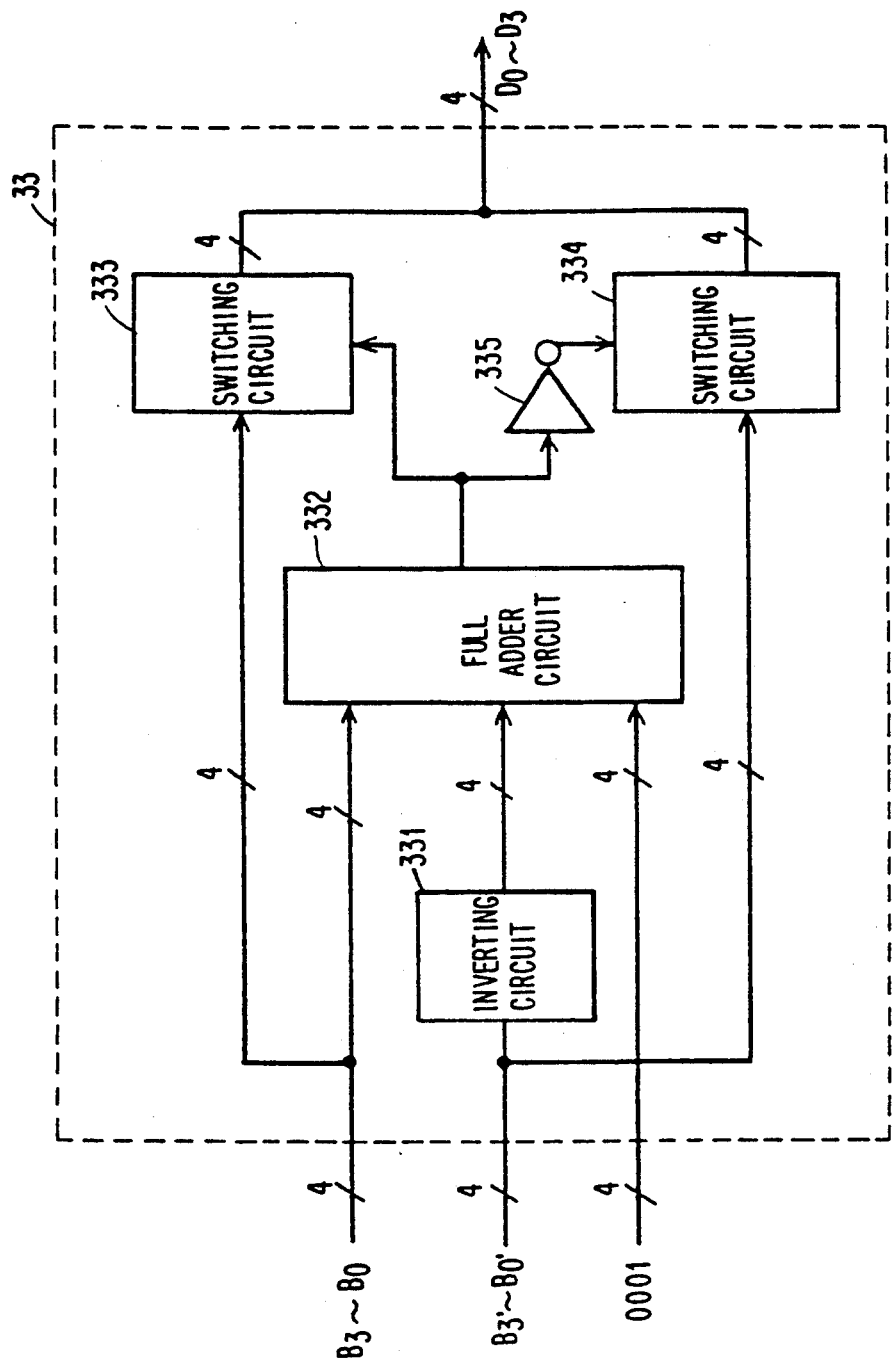
FIG. 12 is a block diagram of the comparison processing circuit 33 shown in FIG. 9.

One example of comparison processing circuit 33 shown in FIG. 9 is shown in FIG. 12. Referring to FIG. 12, comparison processing circuit 33 includes an inverter circuit 331, a full adder circuit 332, a switching circuit 333 and 334, and an inverter 335.

An operation of comparison processing circuit 33 is as follows. First of all, subtraction between applied two data is made, whereby output data is determined depending on whether the result is positive or negative. Subtraction between two data is implemented by adding binary data "1" to the converted data after one data is converted to a negative data. That is, inverter circuit 331 converts data B0' to B3' to negative data, then the converted data are applied to full adder circuit 332. Since binary data "0001" is applied to full adder circuit 332, the conversion of data B0' to B3' to negative data is made.

Full adder circuit 332 performs addition of data B0 to B3 and applied negative data. When data B0 to B3 are larger than data B0' to B3', the final carry output of full adder circuit 332 provides "1". Responsive to this output signal, switching circuit 333 turns on, whereby data B0 to B3 applied from encoder 3 are provided as binary converted data D0 to D3.

To the contrary, when data B0' to B3' are larger than data B0 to B3, the final carry output of full adder circuit 332 provides "0". Responsive to this signal, switching circuit 334 turns on, whereby data B0' to B3' applied from encoder 32 are provided as binary converted data D0 to D3.

Figure 13:
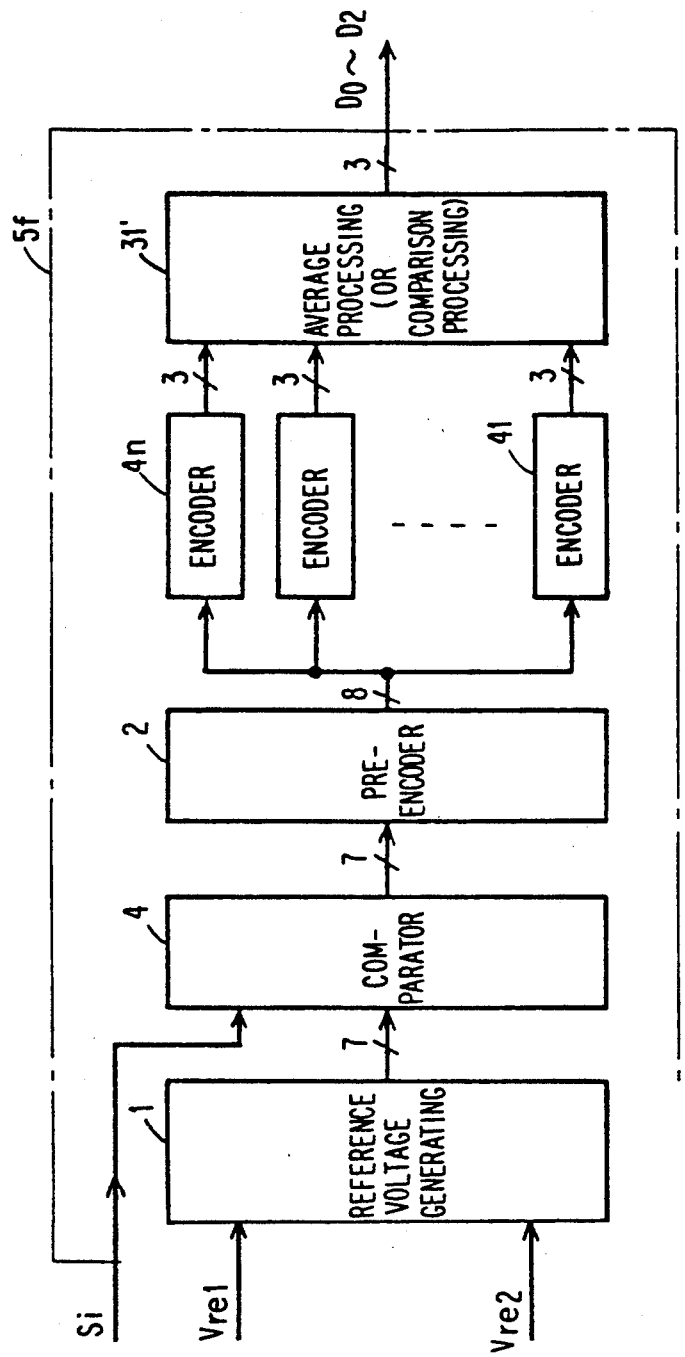
FIG. 13 is a block diagram of a circuit of parallel-type A/D converter showing still another embodiment of the present invention.

A parallel-type A/D converter 5f showing still another embodiment of the present invention is shown in FIG. 13. In any embodiment described above, two encoders have been provided in the outputs of pre-encoder. To enhance the accuracy in A/D conversion, it is useful to employ more encoders. Therefore, A/D converter 5f in FIG. 13 is provided with n (n is an integer more than 3) encoders 4l and 4n. Binary output data provided from encoders 4l to 4n are applied to an averaging circuit (or comparison processing circuit) 31', where similar average processing (or similar comparison processing) is performed. As a result, circuit 31' provides binary converted output data D0 to D2.

In any embodiment described above, an encoder composed of CMOS transistor is employed, while the encoder composed of bipolar transistor or BiCMOS circuit is also available.

Figure 14:
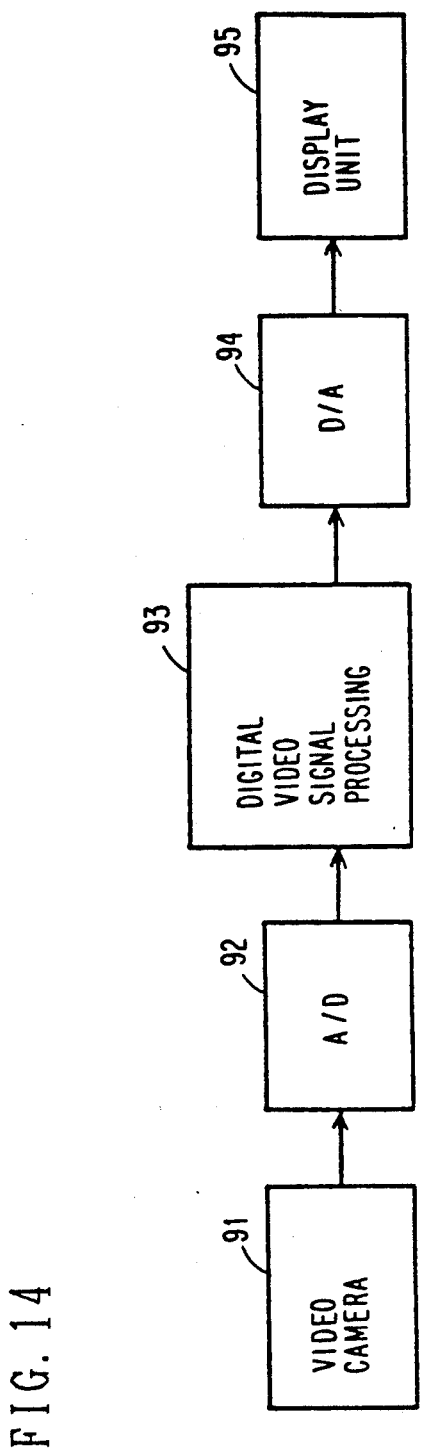
FIG. 14 is a block diagram showing a general configuration for video signal processing.

As described above, employing an A/D converter including a plurality of encoders connected to the outputs of pre-encoder and an averaging circuit or a comparison circuit has lead to an A/D converter capable of providing a correct or approximately correct converted data even in case of multi-addressing. As the embodiments described above, the present invention is applicable to any A/D converter of parallel-type and serial-parallel type. The A/D converter to which the present invention is applied is, as an example, also applied to A/D converter 92 in the video signal processing shown in FIG. 14. As a result, video signal processing can be performed using a correct data without being affected by the generation of multi-addressing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A n-bit analog to digital converter comprising:
voltage reference means for providing a plurality of voltage reference values;
comparator means for comparing said plurality of voltage reference values with an input voltage level and, in response, supplying thermometer code signals on a first plurality of output lines;
pre-encoder means receiving said thermometer code signals and, responsive to a signal level change from a first level to a second level on adjacent ones of said output lines, supplying decoded signals on a second plurality of output lines;
first binary encoder means receiving said decoded signals for supplying a first binary value representing a logical product of respective bits of binary representations of respective binary data corresponding to said decoded signals;
second binary encoder means receiving said decoded signals for supplying a second binary value representing the logical sum of respective bits of said binary representations of said respective binary data corresponding to said decoded signals; and
averaging means for adding said first and second binary values to form a sum of said first and second binary values and, in response to said sum, supplying a corrected binary output value.

2. The A/D converter according to claim 1, wherein said first binary encoder means comprises pseudo-NMOS type read only memory means responsive to said decoded signals for generating corresponding straight binary data having multi-bit, and
said second binary encoder means comprises pseudo-PMOS type read only memory means responsive to said decoded signals for generating corresponding straight binary data having multi-bit.

3. The A/D converter according to claim 2, wherein each of said pseudo-NMOS type and pseudo-PMOS type read-only memory means comprises PMOS transistors and NMOS transistors connected to form the same circuit configuration,
the current drivingability voltage relation between said PMOS transistors and NMOS transistors in said first read only memory means is different from that between said PMOS transistors and NMOS transistors in said second read only memory means.

4. The A/D converter according to claim 1, wherein said pre-encoder means generates a plurality of output signals containing a single activated signal placed at the position corresponding to the peak value of the thermometer code signals.

5. The A/D converter according to claim 1, wherein said averaging means comprises n+1 full adders each having first and second inputs,
each of first inputs of less significant n of said n+1 full adders receiving the corresponding bits of binary data provided from said first binary encoder means, each of the second inputs of less significant n of said n+1 full adders receiving the corresponding bits of binary data provided from said second binary encoder means, and
n of more significant full adders in said n+1 full adders providing said corrected binary output value having n-bit.

6. An A/D converter, comprising:
means for generating a plurality of reference potentials each having a different potential level;
thermometer code generating means each receiving corresponding one of the reference potentials in said plurality of reference potentials, responsive to an analog input, for generating thermometer code corresponding to the level of the analog input signal;

pre-encoder means responsive to the thermometer code provided from said thermometer code generating means for generating a plurality of output signals containing a single activated signal placed at the position corresponding to the peak value indicated by thermometer code, first encoder means responsive to a plurality of output signals provided from said pre-encoder means for generating corresponding binary data having multi-bit, said first encoder means providing logical product data between the corresponding bits of two binary data corresponding to two activated signals in response to said two activated signals included in a plurality of output signals provided from said pre-encoder means;

second encoder means responsive to a plurality of output signals provided from said pre-encoder means for generating the corresponding binary data having multi-bit, said second encoder means providing logical sum data between the corresponding bits of two binary data corresponding to two activated signals in response to said two activated signals included in a plurality of output signals provided from said pre-encoder means; and averaging means for providing average value data of said logical product data and said logical sum data provided from said first and second encoder means.

7. A serial-parallel type A/D converter converting applied analog input signal to digital output data containing predetermined more significant bits and less significant bits, comprising:

more significant bit decision means responsive to an analog input signal for determining more significant bits on digital output data;

reference potential generating means responsive to more significant bits of digital output data for generating a plurality of reference potentials each having a different level within the range determined by more significant bits;

comparator means for comparing said plurality of reference potentials with an input voltage level and, in response, supplying thermometer code signals on a first plurality of output lines;

pre-encoder means receiving said thermometer code signals and, responsive to a signal level change from a first level to a second level on adjacent ones of said output lines, supplying decoded signals on a second plurality of output lines;

first binary encoder means receiving said decoded signals for supplying a first binary value representing a logical product of respective bits of binary representations of respective binary data corresponding to said decoded signals;

second binary encoder means receiving said decoded signals for supplying a second binary value representing the logical sum of respective bits of said binary representations of said respective binary data corresponding to said decoded signals; and averaging means for adding said first and second binary values to form a sum of said first and second binary values and, in response to said sum, supplying a corrected binary output value.

8. The serial-parallel type A/D converter according to claim 7, further comprising subtracter means for subtracting predetermined data from average value data provided from said averaging means.

9. An analog to digital converter comprising:

voltage reference means for providing a plurality of voltage reference values;

comparator means for comparing said plurality of voltage reference values with an input voltage level and, in response, supplying thermometer code signals on a first plurality of output lines;

pre-encoder means receiving said thermometer code signals and, responsive to a signal level change from a first level to a second level on adjacent ones of said output lines, supplying decoded signals on a second plurality of output lines;

first binary encoder means receiving said decoded signals for supplying a first binary value representing a logical product of respective bits of binary representations of respective binary data corresponding to said decoded signals;

second binary encoder means receiving said decoded signals for supplying a second binary value representing the logical sum of respective bits of said binary representations of said respective binary data corresponding to said decoded signals; and comparator processing means for comparing said logical product data and said logical sum data provided from said first and second binary encoder means and selectively providing the larger data of said logical product data and said logical sum data.

10. A binary data generating circuit, comprising:

first encoder means responsive to a plurality of input signals containing a single activated signal for generating corresponding binary data having multi-bit, said first encoder means providing logical product data between the corresponding bits of two binary data corresponding to two activated signals in response to said two activated signals included in a plurality of input signals;

second encoder means responsive to said plurality of input signals containing said single activated signal for generating corresponding binary data having multi-bit, said second encoder means providing logical sum data between the corresponding bits of two binary data corresponding to two activated signals in response to said two activated signals included in a plurality of input signals; and averaging means for providing average value data of said logical product data and said logical sum data provided from said first and second encoders, respectively.

11. A binary data generating circuit, comprising:

first encoder means responsive to a plurality of input signals containing a single activated signal for generating corresponding binary data having multi-bit, said first encoder means providing logical product data between the corresponding bits of two binary data corresponding to two activated signals in response to said two activated signals included in a plurality of input signals;

second encoder means responsive to said plurality of input signals containing said single activated signal for generating corresponding binary data having multi-bit, said second means providing logical sum data between the corresponding bits of two binary data corresponding to two activated signals in response to said two activated signals included in a plurality of input signals; and comparison processing means for comparing said logical product data and said logical sum data provided from said first and second encoders, respectively, and providing the larger data of said logical product data and said logical sum data.

12. An analog to digital converter comprising:

reference potential generating means for generating $2^n-1$ reference potentials;

comparator means for comparing $2^n-1$ reference potentials with an analog input signal and providing $2^n-1$ binary signals as comparison result;

pre-encoder means, responsive to a signal level change from a first level to a second level on adjacent ones of $2^n-1$ binary signals provided from said comparator means for providing $2^n$ binary signals;

first binary encoder means for supplying n first binary signals representing a logical product of respective bits of binary representations of respective binary data corresponding to the $2^n$ binary signals provided from said pre-encoder means;

second binary encoder means for supplying n second binary signals representing the logical sum of respective bits of said binary representations of said respective binary data corresponding to the $2^n$ binary signals provided from said pre-encoder means; and averaging means for adding said first and second binary signals to form a sum of said fist and second binary signals and, in response to said sum, supplying n corrected binary output signals.

* * * * *